United States Patent
Chen

(10) Patent No.: US 11,704,453 B2
(45) Date of Patent: Jul. 18, 2023

(54) DRILL BIT DESIGN SELECTION AND USE

(71) Applicant: Halliburton Energy Services, Inc., Houston, TX (US)

(72) Inventor: Shilin Chen, Montgomery, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 977 days.

(21) Appl. No.: 16/433,937

(22) Filed: Jun. 6, 2019

(65) Prior Publication Data

US 2020/0386055 A1     Dec. 10, 2020

(51) Int. Cl.
G06F 30/17 (2020.01)
E21B 10/00 (2006.01)
E21B 47/007 (2012.01)
E21B 10/54 (2006.01)

(52) U.S. Cl.
CPC .............. *G06F 30/17* (2020.01); *E21B 10/00* (2013.01); *E21B 10/54* (2013.01); *E21B 47/007* (2020.05); *E21B 2200/20* (2020.05)

(58) Field of Classification Search
CPC ....................................................... G06F 30/17
See application file for complete search history.

(56) References Cited

U.S. PATENT DOCUMENTS 5,448,911 A * 9/1995 Mason ..................... E21B 31/03
                                                                73/152.47
5,721,376 A * 2/1998 Pavone ..................... E21B 44/00
                                                                73/152.47
5,852,235 A * 12/1998 Pavone ..................... E21B 44/00
                                                                73/152.45

(Continued)

FOREIGN PATENT DOCUMENTS

WO     2014121448 A1    8/2014

OTHER PUBLICATIONS

"U.S. Appl. No. 17/074,273, Non-Final Office Action", dated Nov. 17, 2022, 29 pages.

(Continued)

*Primary Examiner* — Blake Michener
(74) *Attorney, Agent, or Firm* — Delizio, Peacock, Lewin & Guerra

(57) ABSTRACT

Systems and methods are disclosed for selecting a drill bit design that reduces or eliminates bit induced stick-slip. In some embodiments, each of a set of test drill bits is correlated with stick-slip events, wherein each of the test drill bits has a different design pattern comprising a combination of structural attributes. The design pattern stick-slip correlation includes, for each of the test drill bits, detecting variations in motion of the test drill bit during drilling operation. Stick-slip for each of the test drill bits is detected based on the detected variations in motion of the test drill bits during operation. The correlation further includes in response to detecting stick-slip, recording a stick-slip event in association with the corresponding test drill bit. The method further includes determining a performance efficiency value for each of the plurality of test drill bits and correlating the determined performance efficiency values with the stick-slip events to determine a threshold performance efficiency value. A design pattern for a drill bit is selecting or determined based, at least in part, on the threshold performance efficiency value.

16 Claims, 14 Drawing Sheets

(56) References Cited

U.S. PATENT DOCUMENTS

| | | | | |
|---|---|---|---|---|
| 6,021,377 | A * | 2/2000 | Dubinsky | E21B 44/00 702/9 |
| 6,879,947 | B1 * | 4/2005 | Glass | E21B 45/00 175/48 |
| 8,589,136 | B2 * | 11/2013 | Ertas | E21B 7/00 703/1 |
| 8,863,860 | B2 | 10/2014 | Chen et al. | |
| 9,581,008 | B2 * | 2/2017 | Kyllingstad | E21B 3/022 |
| 9,976,405 | B2 * | 5/2018 | Hohl | E21B 44/02 |
| 10,400,547 | B2 * | 9/2019 | Chen | E21B 41/00 |
| 10,878,145 | B2 * | 12/2020 | Dykstra | E21B 41/0092 |
| 2001/0020551 | A1 * | 9/2001 | Taylor | E21B 10/42 175/57 |
| 2007/0192074 | A1 * | 8/2007 | Chen | E21B 7/04 702/9 |
| 2009/0166091 | A1 * | 7/2009 | Matthews | E21B 10/08 703/7 |
| 2010/0032165 | A1 * | 2/2010 | Bailey | E21B 41/00 703/2 |
| 2010/0224413 | A1 | 9/2010 | Warren | |
| 2011/0077924 | A1 * | 3/2011 | Ertas | E21B 7/00 703/2 |
| 2011/0214878 | A1 | 9/2011 | Bailey et al. | |
| 2012/0111630 | A1 | 5/2012 | Chen et al. | |
| 2012/0312603 | A1 * | 12/2012 | Propes | E21B 10/43 703/7 |
| 2013/0081880 | A1 * | 4/2013 | Schwefe | E21B 10/42 703/1 |
| 2017/0211357 | A1 | 7/2017 | Grosz et al. | |
| 2018/0283161 | A1 * | 10/2018 | Bailey | E21B 45/00 |
| 2019/0106979 | A1 * | 4/2019 | Hadi | E21B 44/04 |
| 2021/0047909 | A1 | 2/2021 | Bailey et al. | |
| 2021/0081506 | A1 * | 3/2021 | Detournay | E21B 41/00 |
| 2022/0121790 | A1 | 4/2022 | Chen et al. | |
| 2022/0121791 | A1 | 4/2022 | Chen et al. | |

OTHER PUBLICATIONS

"U.S. Appl. No. 17/074,352, Final Rejection Action", dated Dec. 9, 2022, 21 pages.

Jain, et al., "High-Frequency Torsional Dynamics of Drilling Systems: An Analysis of the Bit-System Interaction", Paper presented at the IADC/SPE Drilling Conference and Exhibition, Fort Worth, Texas, USA, Mar. 4, 2014, 13 pages.

Jain, et al., "Mitigation of Torsional Stick-Slip Vibrations in Oil Well Drilling through PDC Bit Design: Putting Theories to the Test", Presented at the SPE Annual Technical Conference and Exhibition, Denver, Colorado, USA, Oct. 30, 2011, 14 pages.

"U.S. Appl. No. 17/074,352, Non-Final Office Action", dated Aug. 2, 2022, 25 pages.

Bailey, et al., "Improved Methods to Understand and Mitigate Stick-Slip Torsional Vibrations", Presented at the IADC/SPE Drilling Conference and Exhibition, Fort Worth, Texas, USA, Mar. 6, 2018, 21 pages.

Chen, "Factors Affecting PDC Bit Directional Behaviors: Numerical Simulation and Applications", Proceedings of the International Field Exploration and Development Conference 2017, Chapter 11, Jul. 12, 2018, 19 pages.

Chen, et al., "Identification and Mitigation of Friction- and Cutting-Action-Induced Stick/Slip Vibrations with PDC Bits", Society of Petroleum Engineers Drilling & Completion, vol. 35, Issue 4, Dec. 17, 2020, 12 pages.

Chen, et al., "The Role of Rock-Chip Removals and Cutting-Area Shapes in Polycrystalline-Diamond-Compact-Bit Design Optimization", Society of Petroleum Engineers Drilling & Completion, vol. 30, Issue 4, Dec. 31, 2015, 14 pages.

Davis, et al., "Eliminating Stick-Slip by Managing Bit Depth of Cut and Minimizing Variable Torque in the Drillstring", Presented at the IADC/SPE Drilling Conference and Exhibition, San Diego, California, USA, Mar. 6, 2012, 9 pages.

Jaggi, et al., "Successful PDC/RSS Vibration Management Using Innovative Depth-of-Cut Control Technology Panna Field, Offshore India", Presented at the SPE/IADC Drilling Conference, Amsterdam, The Netherlands, Feb. 20, 2007, 14 pages.

Teale, "The Concept of Specific Energy in Rock Drilling", International Journal of Rock Mechanics and Mining Sciences & Geomechanics Abstracts vol. 2, Issue 1, Mar. 1965, pp. 57-73.

"U.S. Appl. No. 17/074,273, Final Office Action", dated Mar. 3, 2023, 32 pages.

* cited by examiner

700a

| BIT | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| SIZE(IN) | 8.5 | 8.75 | 8.75 | 8.75 | 8.5 | 8.5 | 8.5 | 8.75 | 8.5 | 8.5 | 12.25 | 8.5 | 8.5 | 8.5 |
| BLADES | 5 | 6 | 6 | 5 | 6 | 6 | 7 | 6 | 6 | 7 | 7 | 6 | 6 | 6 |
| DE (%) | 69.31 | 44.81 | 47.48 | 54.42 | 47.68 | 47.33 | 38.27 | 44.90 | 47.68 | 42.60 | 32.04 | 47.68 | 47.09 | 45.04 |
| VIB | none | bit SS | none | none | none | BHA SS | rpm var | bit SS | none | rpm var | bit SS | BHA SS | none | none |
| PRED | N | Y | N | N | N | N | Y | Y | N | Y | Y | N | N | N |

700b

| BIT | 15 | 16 | 17 | 18 | 19 | 20 | 21 | 22 | 23 | 24 | 25 | 26 | 27 |
|---|---|---|---|---|---|---|---|---|---|---|---|---|---|
| SIZE(IN) | 8.5 | 8.5 | 8.5 | 12.25 | 12.25 | 8.5 | 8.75 | 8.5 | 9.5 | 9.875 | 8.75 | 8.5 | 8.75 |
| BLADES | 6 | 6 | 7 | 7 | 7 | 7 | 6 | 6 | 5 | 8 | 6 | 6 | 5 |
| DE (%) | 46.11 | 47.68 | 42.60 | 32.04 | 28.87 | 38.27 | 55.34 | 44.82 | 43.89 | 33.73 | 42.59 | 47.68 | 50.09 |
| VIB | none | none | rpm var | bit SS | bit SS | bit SS | none | none | bit SS | bit SS | bit SS | rpm var | BHA SS |
| PRED | N | N | Y | Y | Y | Y | N | N | Y | Y | Y | N | N |

FIG. 7

DRILL BIT DESIGN SELECTION AND USE

BACKGROUND

The disclosure generally relates to the field of drilling boreholes and more particularly to selecting and using drill bits that may be subject to stick-slip vibration.

Boreholes for oil and gas wells are typically drilled by a rotary drilling process. Drill bits are tools configured to produce a borehole through layers of earth by rotary drilling techniques. A drill bit is installed on the lower end of a drill string and rotated. A drill bit may be rotated by top drive control equipment that imparts rotation to the entire drill string, or alternatively, by a downhole mud motor or other device that selectively rotates the drill bit without rotation of the drill string. Subsurface layers may be mechanically broken by cutter elements (also referred to as "cutters") on the drill bit that are positioned to grind, cut, or otherwise fracture otherwise solid material into cuttings that are circulated to the surface.

Drill bits are frequently classified based in part on the type of cutters. Roller-cone bits utilize tooth-shaped cutter on two or more rollers that rotate across the end surface of the borehole as the bit rotates. Fixed-cutter bits utilize cutters in the form of blades with hard cutting element, typically natural or synthetic diamond, to dislodge formation material by grinding or scraping. Hybrid drill bits combine fixed-cutters and roller-cone cutters.

Any portion of the drill string including the drill bit and/or pipe components that degrades or fails during drilling must be extracted from the borehole and replaced. Since the drill string may weigh hundreds of tons and extend for thousands of feet in a frequently non-linear path, the extraction and replacement process can be very expensive and time consuming. Drill bit durability is therefore a significant factor for overall efficiency of a borehole drilling process. Stick-slip is a phenomenon during drilling in which the drill bit, typically a fixed-cutter or hybrid bit abruptly catches onto the borehole face and ceases motion (stick phase) and then abruptly resumes motion (slip phase). The abrupt sticking and slipping accelerates drill bit wear and causes stick-slip vibration through the drill string that may damage pipe and connection components.

BRIEF DESCRIPTION OF THE DRAWINGS

Embodiments of the disclosure may be better understood by referencing the accompanying drawings.

FIG. 7 is a chart that illustrates records generated by a stick-slip correlator that associate stick-slip events with respective test bits in accordance with some embodiments;

DESCRIPTION

Figure 1:
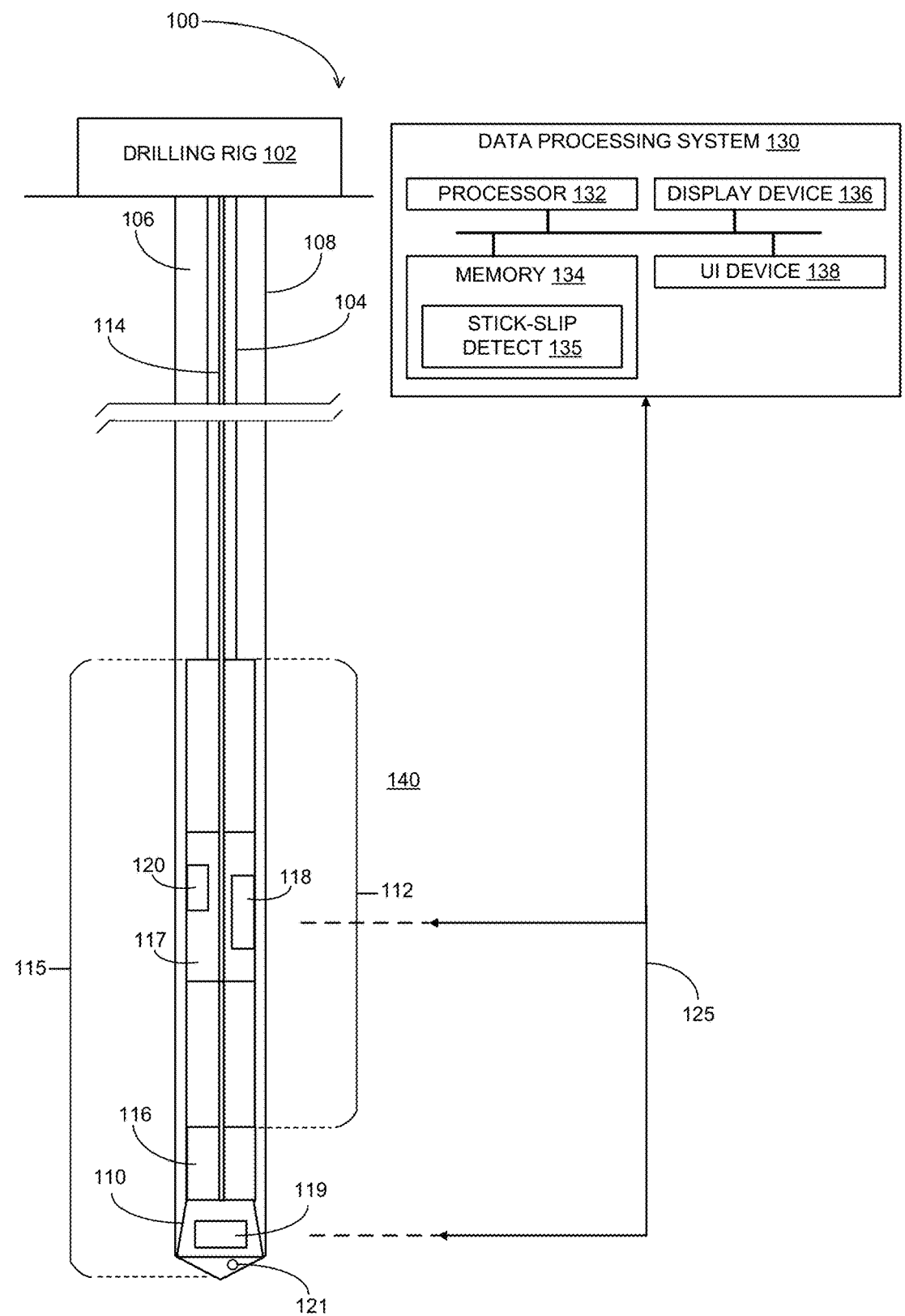
FIG. 1 is a conceptual representation of a drilling system that is utilized for and implements drill bit design selection in accordance with some embodiments.

The description that follows includes example systems, methods, techniques, and program flows that embody embodiments of the disclosure. However, it is understood that this disclosure may be practiced without these specific details. In other instances, well-known instructions, protocols, structures and techniques have not been shown in detail in order not to obfuscate the description.

Overview

Stick-slip is a form of drill string vibration that has become more significant with the proliferation of highly efficient drill bits that utilize polycrystalline diamond cutters (PDC). A PDC bit cuts rock primary by rotary force in contrast to other drill bit designs that primarily grind with less energy required per rotation. Stick-slip may negatively affect drilling rate of penetration (ROP) and service life of drill string components as well as the drill bit itself. Stick-slip is a source of drill string vibration and may be generally characterized as storage and release of energy when the drill string's rotation is momentarily halted or slowed during a stick phase and then abruptly resumes during a slip phase. Stick-slip is typically caused by either the drill bit sticking on the rock face (bit induced stick-slip) or a portion of the drill string friction sticking to the borehole wall (drill string induced stick-slip). Stick-slip occurring at the end of a long drill-string may accumulate and release a large and damaging amount of energy stored along the flexing drill string that may cause damage to the drill bit itself and/or to drill string components.

Disclosed embodiments include systems, sub-systems, devices, components, operations, and functions for selecting or otherwise determining combinations of drill bit structural parameters that in combination reduce or eliminate stick-slip events caused by bit stick. A set of test drill bits each having respective design patterns comprising multiple structural attributes is utilized to determine correlations between bit induced slip-stick events and a drilling performance metric, such as drill bit drilling efficiency. Each drill bit has a respective design pattern comprising a combination of structural attributes. Structural attributes may be structures such as blades and cutters and numbers and other characteristics of the structures on a drill bit. Structural attributes may also be locations of structures on a drill bit including relative positioning among different structures on a drill bit. In some embodiments, each of the test drill bits has a different design pattern than the design patterns of the other test drill bit. The process includes operations and functions for ascertaining rotary drilling performance characteristics such as drilling efficiency and/or reactive torque that may correspond with occurrence stick-slip. In some embodiments, the drilling efficiency may be determined by modeling the bit performance of each test drill bit over a range of operational parameters such as depth-of-cut (DOC).

The set of test bits may comprise a number of fixed cutter PDC drill bits that comprise cutters that remain fixed with respect to the overall drill bit body that includes blades on which the cutters are disposed. Rotary operational metrics associated with stick-slip are recorded for each of the test bits during drilling operations. In some embodiments, the test drill bits may be equipped with motion sensors, such as accelerometers and/or gyroscopic motion sensors. During drilling operations, the sensor(s) detect and record rotary motion information, such as angular accelerations and rotational velocity. The rotary motion information for each test drill bit is analyzed to determine occurrences of drill string vibration that may correspond to stick-slip events. Additionally, the rotary motion information may be analyzed in terms of the type of stick-slip event in terms of whether a given event was caused by bit stick or caused by a portion of the drill string sticking to the borehole.

Disclosed embodiments further include systems, subsystems, devices, components, operations, and functions for determining a threshold drilling performance value, such as a threshold drilling efficiency, based on modeled or measured drilling performance efficiency in combination with the recorded stick-slip events. The modeled performance efficiency values, such as average drilling efficiencies, may be correlated with stick-slip events recorded for a set of test drill bits each having a mutually distinct design pattern that includes multiple structural and operations parameters. The correlation may first be utilized to identify a threshold performance efficiency value above or below which bit induced stick-slip does not occur. The threshold performance efficiency value, such as an average drilling efficiency value, can be utilized as a drill bit model design limitation. For example, when entering a drill bit model design, the combination of structural attributes are pre-selected or post-selected such that the modeled drilling efficiency meets the threshold drilling performance metric.

The correlation of the stick-slip events with the drilling performance metric may be further utilized to identify the drill bit design patterns for the test drill bits for which no or minimal bit induced stick-slip was detected. For example, the design patterns for the test drill bits for which no or minimal bit induced bit slip was detected may be processed by a bit attribute correlator that is configured to apply weightings to structural attributes For instance, the process may include correlating the stick-slip event information and the drilling performance efficiency values, such as modeled average drilling efficiency for each of the test drill bits to identify a threshold drilling performance value. The threshold drilling performance value, such as an identified average drilling efficiency value, is utilized to select or determine a drill bit design pattern comprising multiple different structural attributes. The selected design pattern can be used to design a drill bit using the specified combination of structural attributes of the design pattern and/or may be used to select an already fabricated drill bit from among a set of available drill bits to be utilized for drilling.

EXAMPLE ILLUSTRATIONS

FIG. 1 is a block diagram depicting a drilling system 100 that is configured to collect stick-slip information during drilling operations, such as measuring while drilling (MWD) or logging while drilling (LWD) operations, in accordance with some embodiments. Drilling system 100 includes a drilling rig 102 comprising various mechanical and electronic systems, subsystems, devices, and components configured to lower, rotate, and otherwise operate a drill string. The drill string includes, among other components, a section of drilling pipe 104 coupled at one end to a top drive (not depicted) within drilling rig 102. Drilling pipe 104 is coupled at the other end to a bottom hole assembly (BHA) 115 that includes a drill bit 110 on its lower end. BHA 115 further includes a steering actuator 116 configured either as a rotary steering system or motor driven device to determine the drilling direction by adjusting the direction of drill bit 110.

Drill bit 110 may be actuated by rotation imparted to the drill string by the top drive within drilling rig 102. A borehole 106 having a cylindrically contoured borehole wall 108 is formed as drill bit 110 is rotated within a subterranean region 140. As drill bit 110 rotates, a pump (not depicted) within drilling rig 102 pumps drilling fluid, sometimes referred to as "drilling mud," downward through a drilling fluid conduit 114 that is formed within the various sections of the drill string. The drilling fluid cools and lubricates drill bit 110 as it exits drill bit 110.

BHA 115 further includes a drill collar 112 that provides downward weight force on drill bit 110 for drilling. Drill collar 112 comprises one or more thick-walled cylinders machined from various relatively high density metals or metallic alloys. While not expressly depicted in FIG. 1, drill collar 112 may comprise multiple distinct cylindrical members that are interconnected using releasable connections such as threaded connectors integral to the individual drill collar members.

Drill collar 112 is further configured to support a logging tool assembly 117 that includes a sensor 120 for measuring material properties to determine, for example, the material composition of various layers within subterranean region 140. Tool assembly 117 further includes information processing and communication module 118 for transmitting the measured information via a telemetry link 125 to a data processing system 130. Telemetry link 125 includes transmission media and endpoint interface components configured to employ a variety of communication modes. The communication modes may comprise different signal and modulation types carried using one or more different transmission media such as acoustic, electromagnetic, and optical fiber media.

During drilling operations, information from the logging tool that includes sensor 120 are processed by data processing system 130 to determine downhole material properties information. For instance, data processing system 130 may comprise processing components configured to derive formation material properties from raw and/or pre-processed measurement data, such as electromagnetic induction and/or gamma radiation data, collected by sensor 120.

Data processing system 130 includes a processor 132, a display device 136, and a memory device 134 into which stick-slip detection components 135 are loaded. Stick-slip detection components 135 comprise program instructions configured to detect and classify stick-slip events based on drill bit motion information such as rotational velocity and radial and axial acceleration information. Data processing system 130 may further include a user input device 138 that may be used to input instructions and evaluate processing results.

Drilling system 100 is configured to test one or more bits, such as drill bit 110, to determine stick-slip behavior during operation over various operational ranges. In some embodiments, a set of multiple test drill bits, including drill bit 110, are tested during drilling operation of drill system 100 and possibly other drilling systems to collect and process stick-slip information. For instance, drill bit 110 is configured to include bit motion sensors in the form of an accelerometer 119 and a gyroscopic velocity sensor 121. During operation, acceleration information detected by accelerometer 119 and rotational velocity information from velocity sensor 121 are collected and transmitted to data processing system 130. As depicted and described in further detail with reference to FIGS. 2, 3, 4, 5A, and 5B, the acceleration and rotational velocity information are recorded in a time line sequence such that time variation information, such as rotational acceleration can be derived.

The bit motion information collected during drilling operation and transmitted to data processing system 130 may be stored as records within memory 134 or other computer storage. Stick-slip detection components 135 are configured to interpret the bit motion information to detect occurrences of stick-slip and classify each occurrence as either bit induced or drill string induced. As utilized herein, "bit induced" refers to instances of stick-slip caused by the drill bit catching or sticking to the borehole face. "Drill string" induced refers to instances of stick-slip caused by the outer surface of a portion of the drill string, such as drilling pipe 104 or drill collar 112, catching or sticking to the surface of borehole 108. Since drill string induced stick-slip is frequently caused by sticking of the annular portions of BHA 115 comprising drill collar 112, drill string induced stick-slip may also be referred to as BHA induced stick-slip.

The rotational speed and acceleration information measured by sensors 119 and 121 may be recorded downhole such as by module 118 and transmitted continuously or intermittently to data processing system 130. Stick-slip detection components 135 detect occurrences of stick-slip by reading the velocity and acceleration information to determine instances during drill operation in which the rotational speed of drill bit 110 reduces to zero or near zero. Stick-slip detection components 135 are further configured to interpret characteristics of the velocity and acceleration information indicating stick-slip to further determine whether the stick-slip was bit induced or drill string induced. Stick-slip components 135 record the occurrences of sticks-slip, referred to herein as stick-slip events, as well as whether the stick-slip events are bit or drill string induced in association with the identity of the drill bit under test, such as drill bit 110. As depicted and described in further detail with reference to FIGS. 2-13, the overall drill bit design selection process includes stick-slip testing of multiple different drill bits. Each of the tested drill bits has a respective design pattern comprising multiple structural attributes such as bit size, number of blades, cutter back rake angle, cutter chamfer size, etc. In some embodiments, the design patterns are mutually distinct in terms of each comprising a different combination of structural attributes. Structural attributes may be structures such as blades and cutters and numbers and/or other characteristics of the structures on a drill bit. Structural attributes may also be locations and orientations of structures on a drill bit including relative positioning among different structures on a drill bit. The design selection system and method further includes components for collecting the stick-slip test data for the multiple test drill bits and correlating the stick-slip data with a performance efficiency metric to determine a performance efficiency value at or above which bit induced stick slip is minimized or eliminated.

Figure 2:
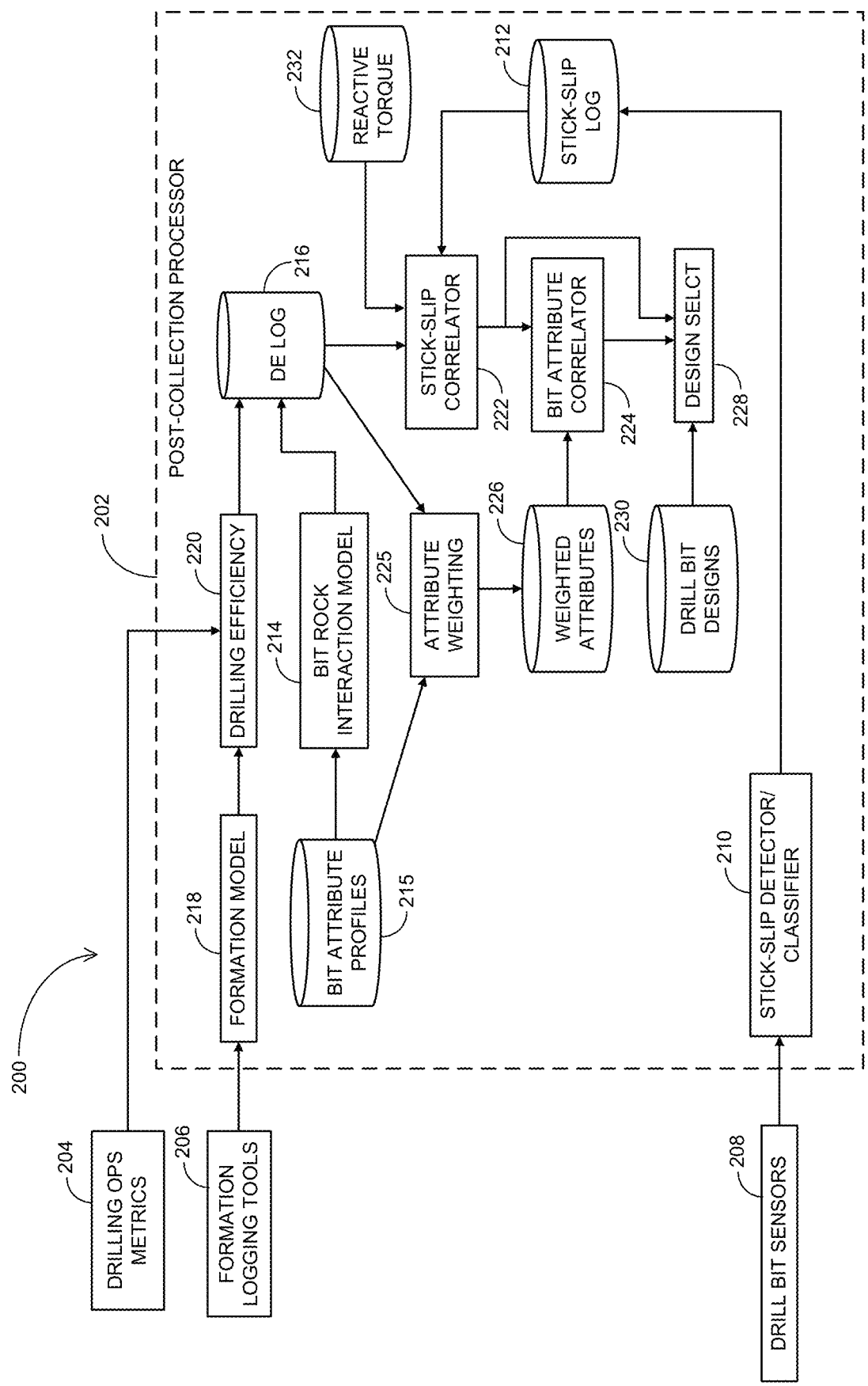
FIG. 2 is a block diagram depicting a drill bit design system in accordance with some embodiments.

FIG. 2 is a block diagram depicting a drill bit design system 200 in accordance with some embodiments that utilize stick-slip test data for a set of multiple drill bits in combination with performance efficiency data to select or determine drill bit designs. Design system 200 includes a post-collection processor 202 that receives test information for drilling operations conducted using multiple drill bits each having distinct design patterns. Drill-bit motion data such as acceleration and rotational velocity data is provided from each of the drill bit test operations by the respective drill bit sensors 208 for each of the test drill bits. In association with the bit motion data for each of the drill bit tests, post-collection processor 202 receives corresponding formation properties information, such as formation material information (e.g., compressive rock strength information) from formation logging tools 206 used for each of the bit test operations. Post-collection processor 202 also receives drilling operational metrics 204, such as weight-on-bit (WOB), torque-on-bit (TOB), and rate-of-penetration (ROP) that may be collected by onsite tools during the respective bit test operations.

Post-collection processor 202 includes a stick-slip detector 210 that is configured to measure, detect, or otherwise determine occurrences of stick-sip events during drill bit test operations and to record the occurrences in a stick-slip log 212. A formation model 218 is included in and/or generated by post-collection processor 202 and receives input from formation logging tools 206. Formation model 218 is utilized to provide the material strength, such as rock compressive strength, as input to a drilling efficiency (DE) computation unit 220. DE computation unit 220 determines drilling efficiency values for various operational points based on drilling operation metrics 204 and metrics from formation model 218. DE computation unit 220 generates resultant drilling efficiency values for drill bits used for the bit test operations and stores the values in records within a drilling efficiency (DE) log 216. In some embodiments, post-collection processor 202 includes a bit-rock interaction model 214 for determining drilling efficiency values based on records within a bit attributes profiles log 215.

The drilling efficiency information in DE log 216 and/or other performance efficiency input such as from reactive torque log 232, is processed by a stick-slip correlator 222 in conjunction with the stick-slip event information within stick-slip log 212. In some embodiments, stick-slip correlator 222 correlates the performance efficiency input with the stick-slip event data to determine drill bit centric correlations. The correlations may be used by stick-slip correlator 222 to determine a performance efficiency threshold that may be used by a design select component 228 to determine or select a drill bit design from a set of drill bit designs and/or structural attributes of such designs within a drill bit design log 230. In addition or in the alternative, design select component 228 may select one or more drill bit designs and/or structural attributes based on structural attribute priority information generated by a bit attribute correlator 224. An attribute weighting component 225 is configured to determine average DE values from DE log 216 for each of the test bits and to retrieve the structural attributes of those bits from bit attributes profiles log 215. Attribute weighting component 225 may relate DE values and/or variations in DE values to determine which structural attributes and combinations of attributes have a greater effect on drilling efficiency values. The attribute weighting information is recorded in a weighted attributes log 226 and accessible by bit attribute correlator 224.

A design selection/determination sequence may include stick-slip detector 210 receiving bit motion data from one or more of the drill bit sensors 208. While depicted as a single box for ease of illustration, stick-slip detector 210 may comprise multiple individual processing components that individually process bit motion information from one or more of bit sensors 208. Stick-slip detector 210 is configured, using any combination of program instructions, to perform operations and functions performed by stick-slip detector components 135 in FIG. 1. For instance, stick-slip detector 210 is configured to determine/detect occurrences of stick-slip during the test operation of each of the set of test drill bits. Stick-slip detector 210 is further configured to classify each of the detected stick-slip events as being bit induced or drill string induced.

Stick-slip detector 210 determines occurrences of stick-slip by detecting instances in which the drill bit rotational speed momentarily stops or almost stops followed within seconds or fractions of a second by resumed rotation. Stick-slip detector 210 classifies the detected stick-slip events as either bit induced or drill string induced by interpreting characteristics of the acceleration and rotational velocity data that indicate stick-slip. For example, FIGS. 3, 4, 5A and 5B illustrate bit motion data in the form of vibration profiles for each of four different test drill bits from among a set of test drill bits processed by post-collection processor 202.

Figure 3:
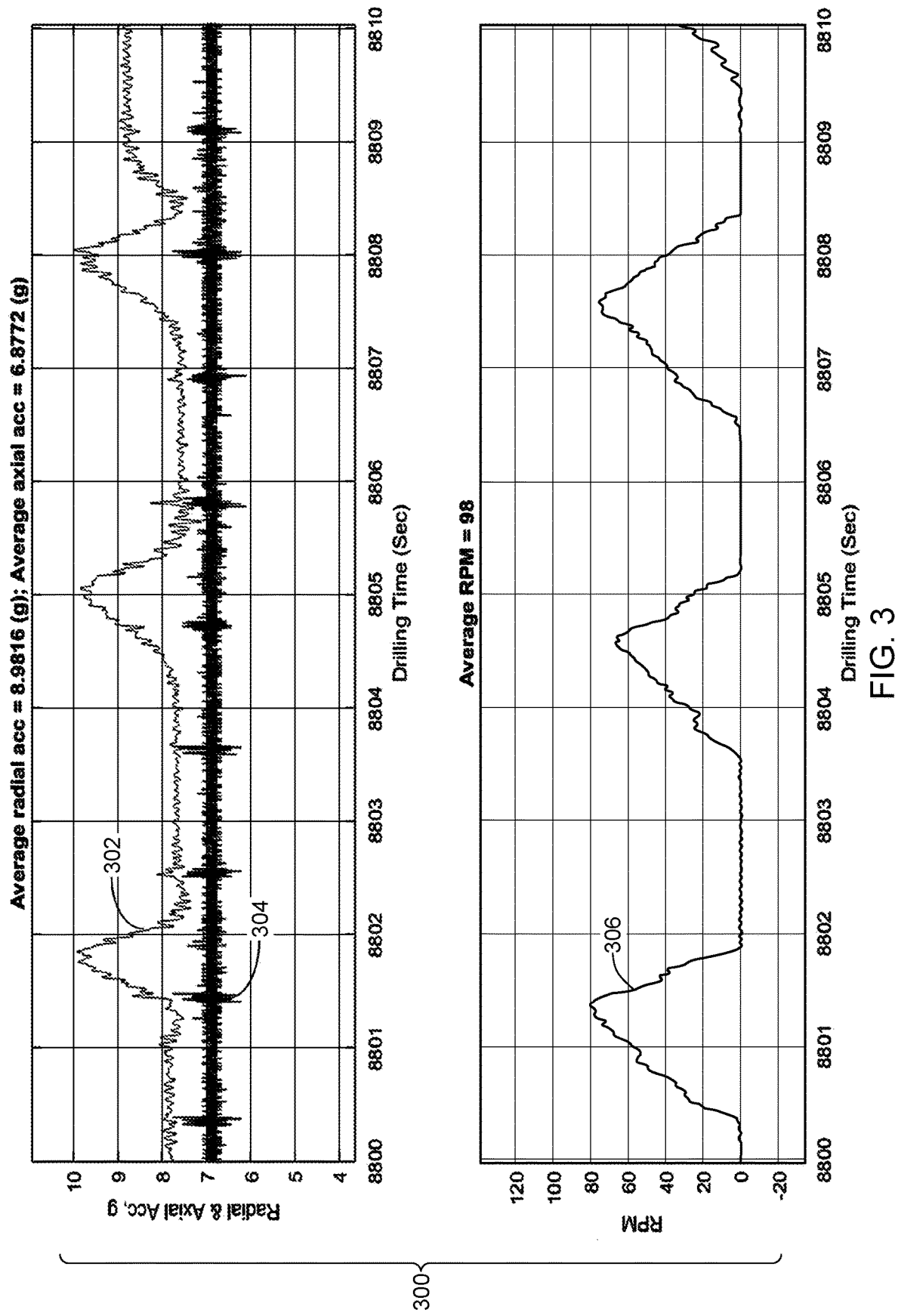
FIG. 3 is a graph that illustrates a vibration profile for a test drill bit in accordance with some embodiments.
Figure 4:
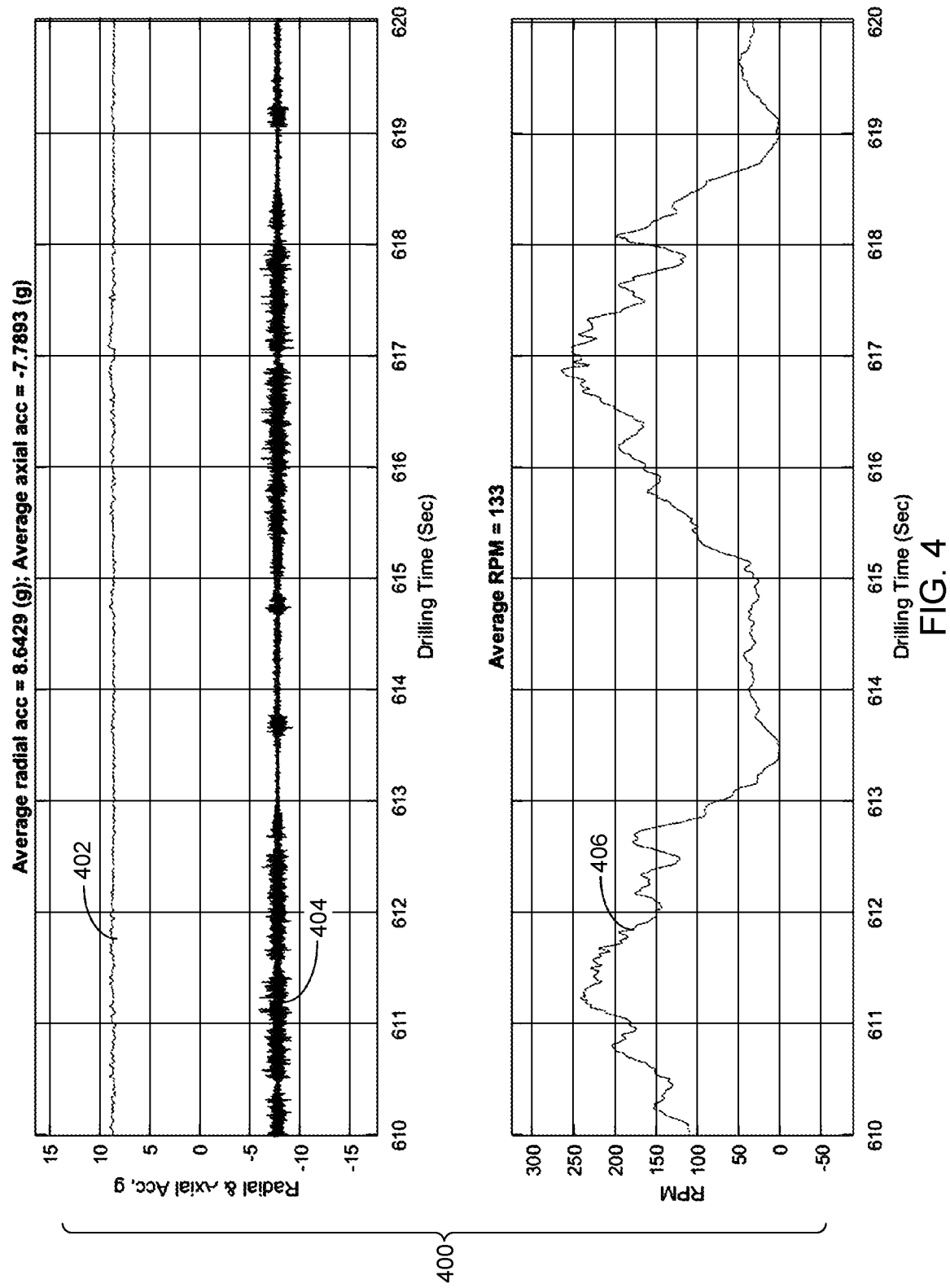
FIG. 4 is a graph that depicts a vibration profile for a test drill bit in accordance with some embodiments.

Referring to FIGS. 3 and 4 in conjunction with FIG. 2, exemplary respective vibration profiles 300 and 400 are depicted for a first and a second test drill bit for which stick-slip is detected, such as by stick-slip detector 210, during drilling operation that applied a non-motor push-the-bit drilling actuation according to one or more embodiments of the present disclosure. Vibration profile 300 includes a radial acceleration curve 302, an axial acceleration curve 304, and a rotational velocity curve 306. Stick-slip detector 210 detects stick-slip for the first test bit by identifying the repeating occurrences in which rotational velocity curve 306 reaches a rotational speed of zero (zero RPM) or near zero. Stick-slip detector 210 classifies the stick-slip event(s) as drill string induced based on a combination of at least rotational velocity and axial acceleration characteristics. Specifically, the stick-slip is classified as drill string induced based on the relatively low axial vibration during the slip phase indicated by axial acceleration curve 304.

Vibration profile 400 includes a radial acceleration curve 402, an axial acceleration curve 404, and a rotational velocity curve 406. Stick-slip detector 210 detects stick-slip for the second test bit by identifying the repeating occurrences in which rotational velocity curve 406 reaches a rotational speed of zero RPM or near zero RPM. Stick-slip detector 210 classifies the stick-slip event(s) as drill string induced based on a combination of at least rotational velocity and axial acceleration characteristics. Specifically, the stick-slip is classified as drill string induced based on the relatively low axial vibration during slip phase indicated by axial acceleration curve 404.

Figure 5A:
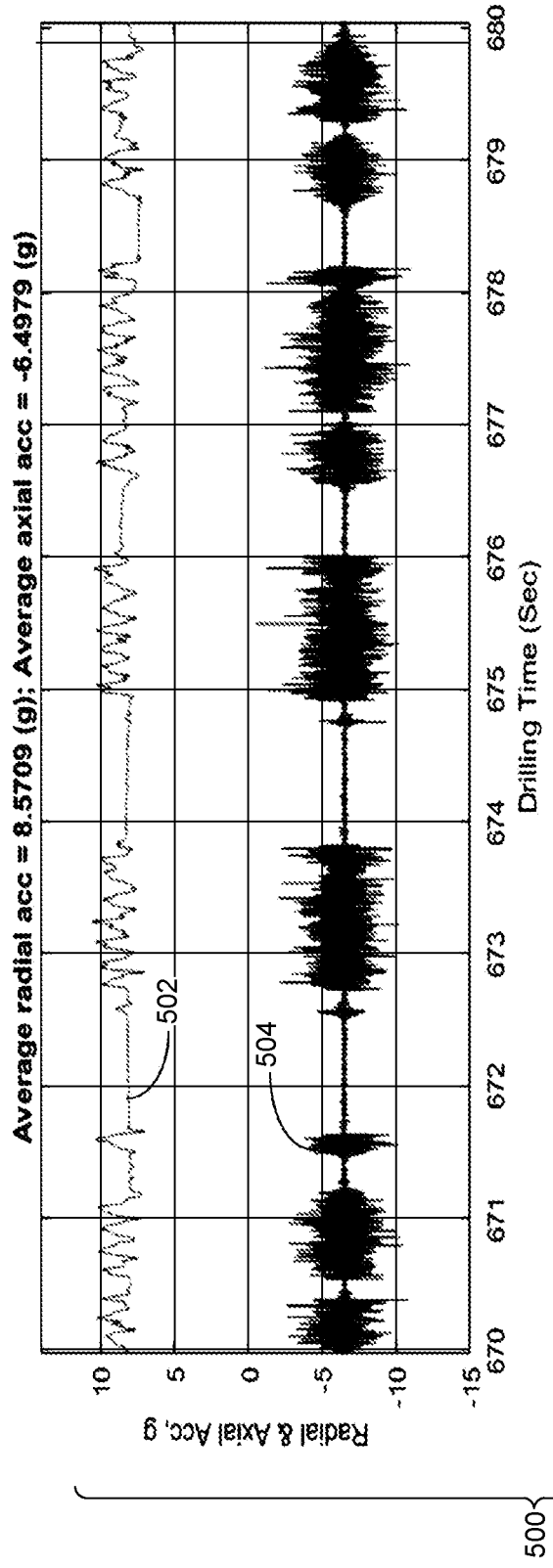
FIG. 5A and FIG. 5B are graphs that illustrate vibration profiles for test drill bits in accordance with some embodiments.
Figure 5A:
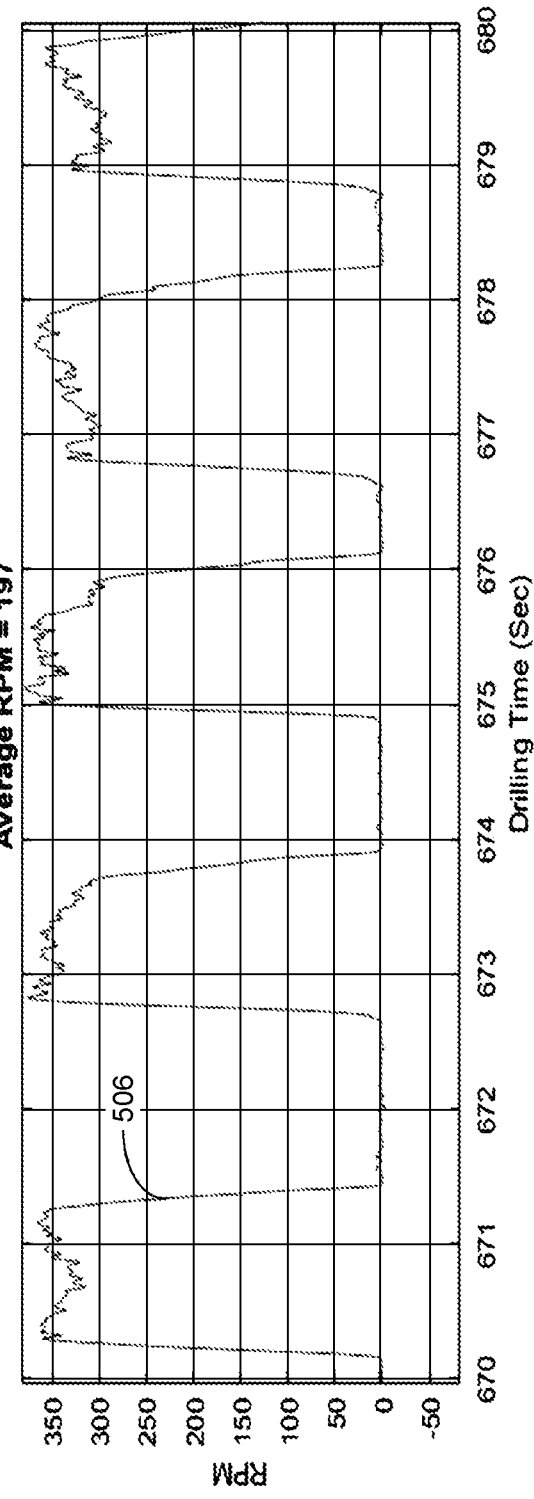

Referring to FIG. 5A in conjunction with FIG. 2, an exemplary vibration profile 500 for a third test drill bit is depicted for which stick-slip is detected, such as by stick-slip detector 210, during drilling operation that applied motor driven drilling actuation according to one or more embodiments of the present disclosure. Vibration profile 500 includes a radial acceleration curve 502, an axial acceleration curve 504, and a rotational velocity curve 506. Stick-slip detector 210 detects stick-slip for the third test bit by identifying the repeating occurrences in which rotational velocity curve 506 reaches a rotational speed of zero or near zero RPM. Stick-slip detector 210 classifies the stick-slip event(s) as bit induced based on a combination of at least rotational velocity and axial acceleration characteristics. Specifically, the stick-slip is classified as bit induced based on the relatively high axial vibration during slip phase indicated by axial acceleration curves 504. Another characteristic of bit induced stick-slip is a coupling of axial vibration and torsional vibration.

Figure 5B:
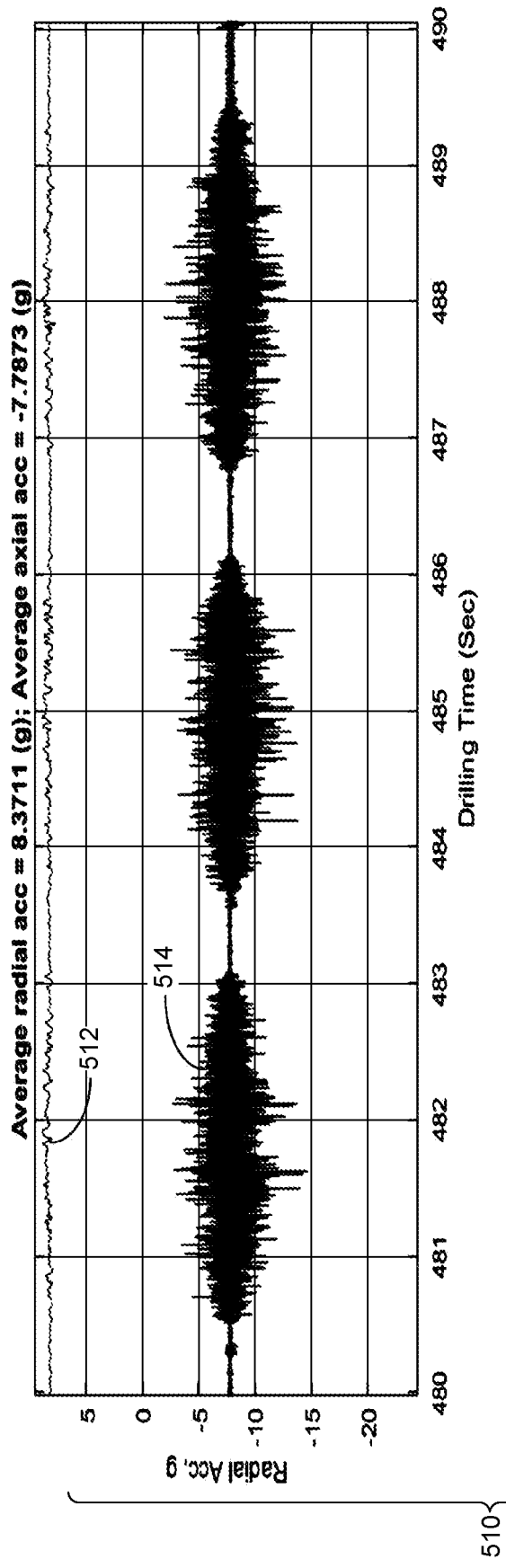
Figure 5B:
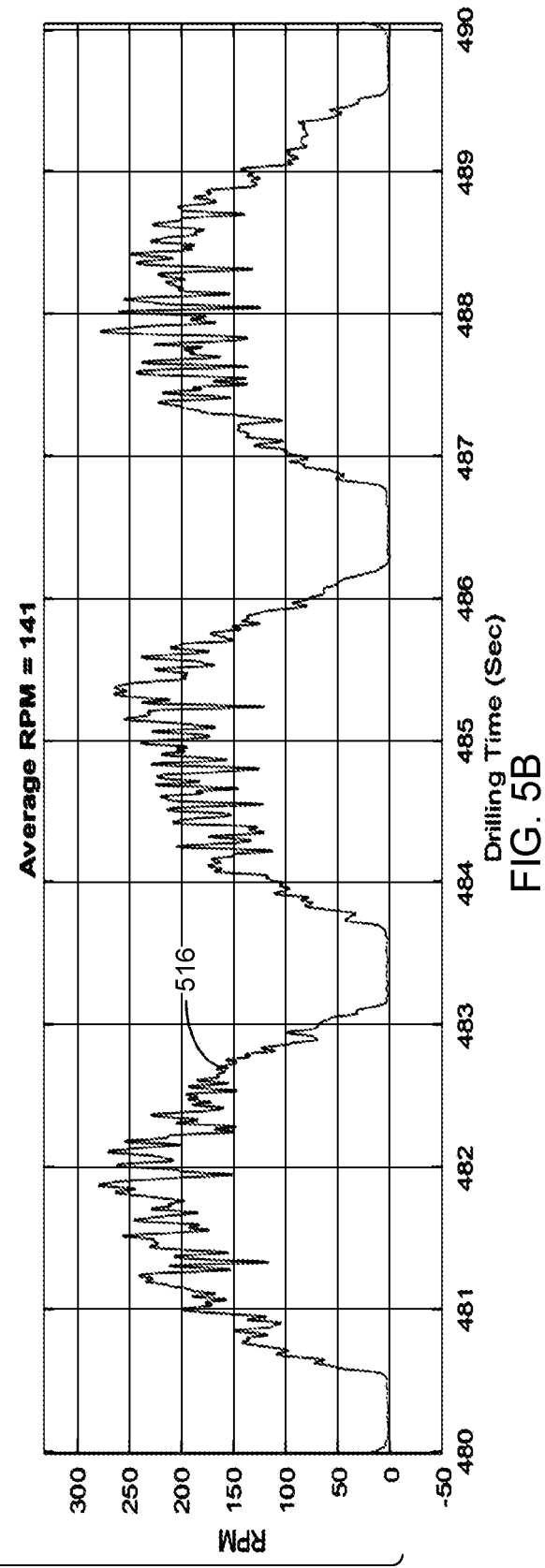
Figure 6:
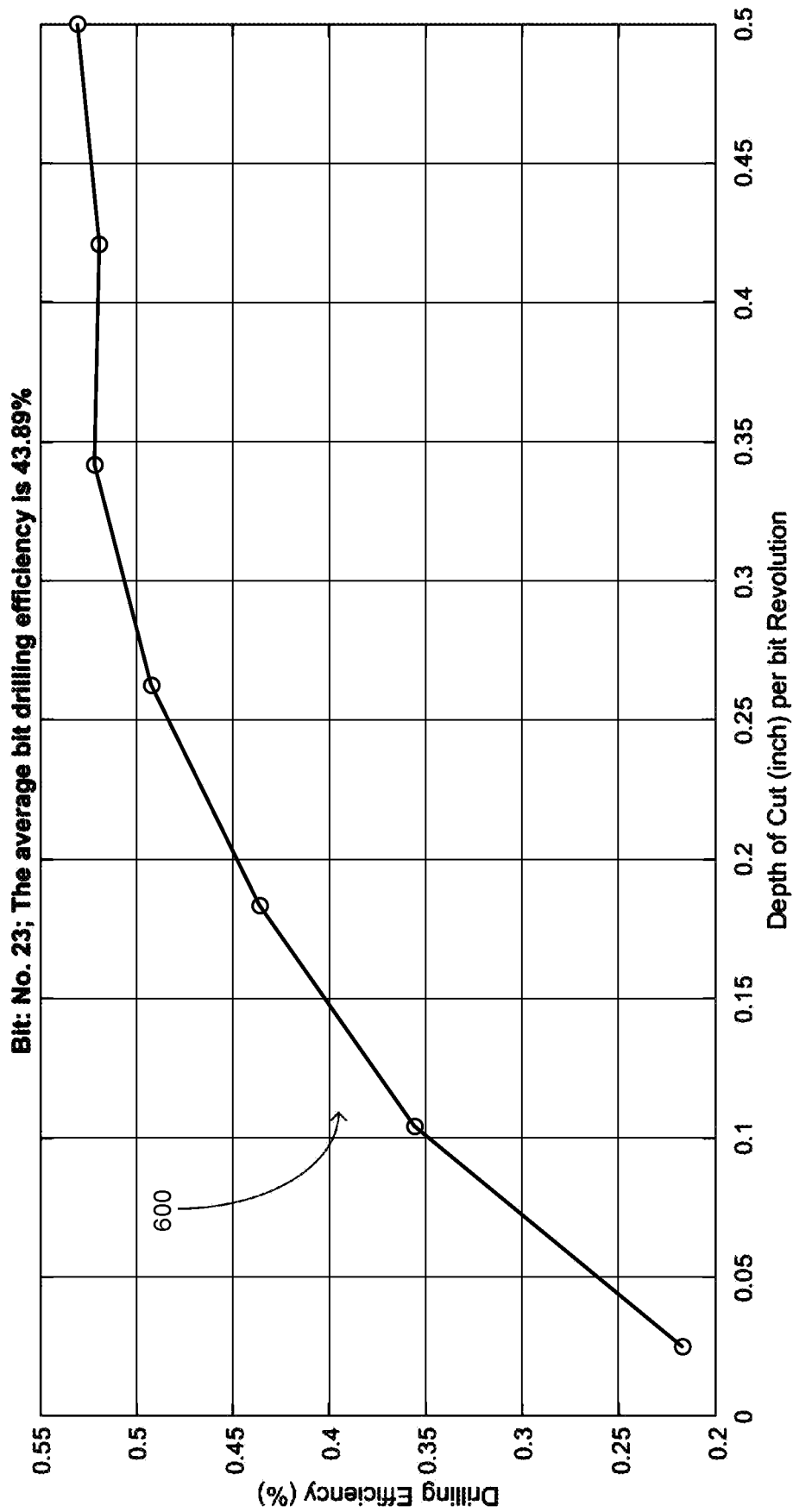
FIG. 6 is a graph that depicts a drilling efficiency profile generated by a drill bit performance model for an individual test bit in accordance with some embodiments.

Referring to FIG. 5B in conjunction with FIG. 2, an exemplary vibration profile 510 for a fourth test drill bit is depicted for which stick-slip is detected during drilling operation that applied motor driven drilling actuation according to one or more embodiments of the present disclosure. Vibration profile 510 includes a radial acceleration curve 512, an axial acceleration curve 514, and a rotational velocity curve 516. Stick-slip detector 210 detects stick-slip for the fourth test bit by identifying the repeating occurrences in which rotational velocity curve 516 reaches a rotational speed of zero or near zero RPM. Stick-slip detector 210 classifies the stick-slip event(s) as bit induced based on a combination of at least rotational velocity and axial acceleration characteristics. Specifically, the stick-slip is classified as bit induced based on the relatively high axial vibration during slip phase indicated by axial acceleration curve 514. Another characteristics of bit induced stick-slip is a coupling of axial vibration and torsional vibration.

The stick-slip detection and classification information for each of the drill bits determined by stick-slip detector in the set is sent to and recorded in stick-slip log 212 with a bit induced stick-slip, drill string induced stick-slip, or no stick slip indication for each drill bit. The stick-slip data in stick-slip log 212 may be accessed by stick-slip correlator 222 that is configured to correlate the stick-slip data with performance efficiency information such as drilling efficiency information and/or reactive torque information. In the depicted embodiment, stick-slip correlator 222 correlates the stick-slip data from stick-slip log 212 with drilling efficiency information obtained from DE log 216. The drilling efficiency data within DE log 216 may be obtained from a drill bit performance model such as bit rock interaction model 214 that is configured to generate drilling efficiency values as a function of depth-of-cut (DOC) per revolution. For example, referring to FIG. 6 in conjunction with FIG. 2, an exemplary drilling efficiency (DE) profile 600 may be generated by bit rock interaction model 214 for one of the test drill bits according to one or more embodiments of the present disclosure. As shown, DE profile 600 includes drilling efficiency values obtained by the model over a DOC per revolution range from 0 to 0.5 inches. An average DE for each DE profile corresponding to each test drill bit may be determined and stored within DE log or may be determining during profile processing such as by stick-slip correlator 222. The structural attributes for the test bit are input to bit rock interaction model 214 to generate DE profile 600 particular to the test bit. The structural attributes for the test bit represented by DE profile 600 are recorded in bit attributes profiles log 215 that records the design patterns of each of the drill bits under test.

In addition or alternatively, the drilling efficiency data may be calculated based on formation and drilling operation data collected during the stick-slip testing of each of the drill bits. For instance, formation model 218 may be generated based on input from formation logging tools 206 and utilized to provide the material strength, such as rock compressive strength, as input to DE computation unit 220. DE computation unit 220 may further receive drilling operation metrics 204 and determine drilling efficiency for various operational points based on the relation $$DE = \frac{\sigma_{rock}}{E_s},$$

in which $\sigma_{rock}$ is the compressive rock strength and $E_s$ is the specific energy determined in accordance with the relation:

$$E_s = \frac{WOB}{A} + \frac{120\pi(RPM)(TOB)}{A(ROP)},$$

in which A is a drilling cross-sectional area such as of the drilled hole that would be formed by the drill bit face.

Stick-slip correlator 222 is configured to correlate the drilling efficiency values, such as average drilling efficiencies for each of the test drill bits, with the stick-slip events recorded in stick-slip log 212. As part of the correlation stick-slip correlator may generate records that, based on drill bit identifier (ID), associate the recorded stick-slip events for each drill bit with drilling efficiency data and drill bit attribute combinations for the same drill bit. For example, referring to FIG. 7 in conjunction with FIG. 2, example records generated such as by stick-slip correlator 222 are depicted that associate stick-slip events with respective test bit data for 27 different drill bits according to one or more embodiments of the present disclosure. The row-wise records are shown within tables 700a and 700b and associate each of bits 1-27 with a corresponding design pattern defined by a set of structural attributes including bit size and number of blades.

As part of the correlation process, stick-slip correlator 222 compares the average drilling efficiency values for all of the test drill bits that based on the stick-slip classification have bit induced stick-slip, to determine which has the highest drilling efficiency value. In the depicted example, drill bits 2, 8, 11, 18, 19, 20, 23, 24, and 25 are recorded in the records of tables 700a and 700b as having bit induced stick-slip. Within this set of drill bits, stick-slip correlator 222 determines that bit 8 has the highest average drilling efficiency of 44.90%. Stick-slip correlator 222 may then determine a threshold drilling efficiency (DE) value to be higher than the determined highest value for the drill bits having bit induced stick-slip. In the depicted example, stick-slip correlator 222 may determine a threshold drilling efficiency value to be 45%.

In some embodiments, the threshold DE value determined by stick-slip correlator 222 may be utilized by design select component 228 to select or determine a drill bit design pattern. Design select component 228 may apply the threshold DE value to select a drill bit design pattern from a set of recorded drill bit design patterns recorded within drill bit design log 230. In addition or alternatively, design select component 228 may apply the threshold DE to select individual structural attributes of a drill bit that is to be fabricated.

In some embodiments, bit attribute correlator 224 may generate structural attribute priority information that can be used by design select component 228 in addition to the threshold DE value to select or determine a drill bit design. For example, attribute weighting component 225 may determine from DE log 216 the average DE values for each of the test bits and retrieve the structural attributes of those bits from bit attributes profiles log 215. Attribute weighting component 225 may then relate DE values and/or variations in DE values to determine which structural attributes and combinations of attributes have a greater effect on DE.

Figures 8, 9, 10, 11:
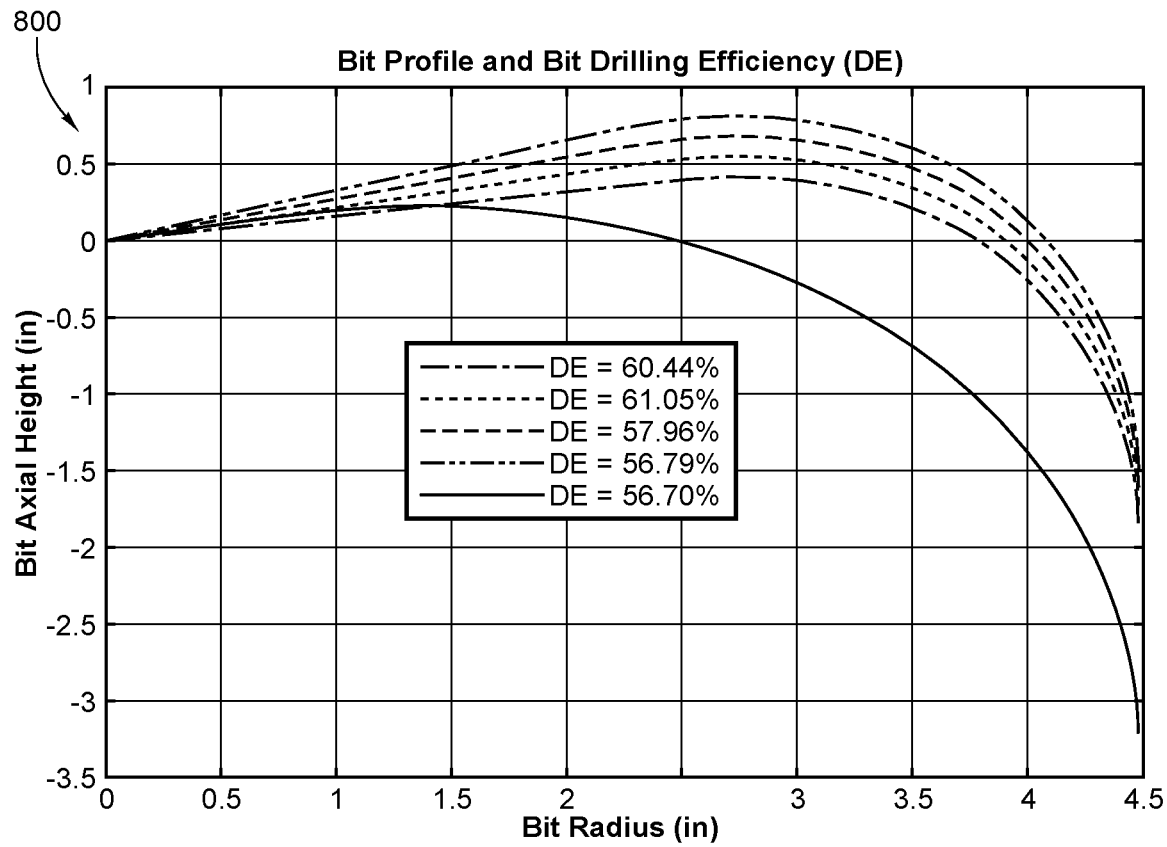
FIG. 8 is a graph that depicts curves that relate average drilling efficiency values with bit profiles and drilling efficiency values.
FIG. 9 is a chart that illustrates a record that indicates correspondence between variations in a cutter back rake angle parameter and drilling efficiency.
FIG. 10 is a chart that depicts a record that indicates correspondence between variations in a cutter chamfer size parameter and drilling efficiency.
FIG. 11 is a chart that illustrates a record that indicates correspondence between the types of backup cutters used for drill bits and drilling efficiency.

FIGS. 8-11 depict examples of data constructs that may be generated by weighting component 225 and stored in weighted attributes log 226 according to one or more embodiments of the present disclosure. For example, FIG. 8 depicts a set of bit profile curves 800 that relates average drilling efficiency values with bit profile parameters. Each of bit profile curves 800 corresponds to a distinct individual test bit profile contour including bit height and bit radius and the corresponding average DE value is encoded thereon such as by color coding. As shown by curves 800, the maximum difference among the average DEs is less than 4% indicating that bit profile has a moderately to low impact on drilling efficiency. FIG. 9 illustrates a record 900 that associates variations in a cutter back rake angle parameter and drilling efficiency. As shown, DE values vary inversely with the cutter back rake angle such that an increase in back rake angle results in decreased DE values. The relatively large variation in DE from a back rake angle range of 10 to 25 degrees indicates that the threshold DE may be not be met for back rake angles greater that 20 degrees. FIG. 10 depicts a record 1000 that associates variations in a cutter chamfer size and drilling efficiency including generally that increasing chamfer size reduces DE. FIG. 11 illustrates a record 1100 that indicates correspondence between the types of backup cutters used for drill bits and drilling efficiency. Record 1100 may generally indicate that adding backup cutters to primary cutters reduces DE and therefore increase the likelihood of stick-slip.

Figure 12:
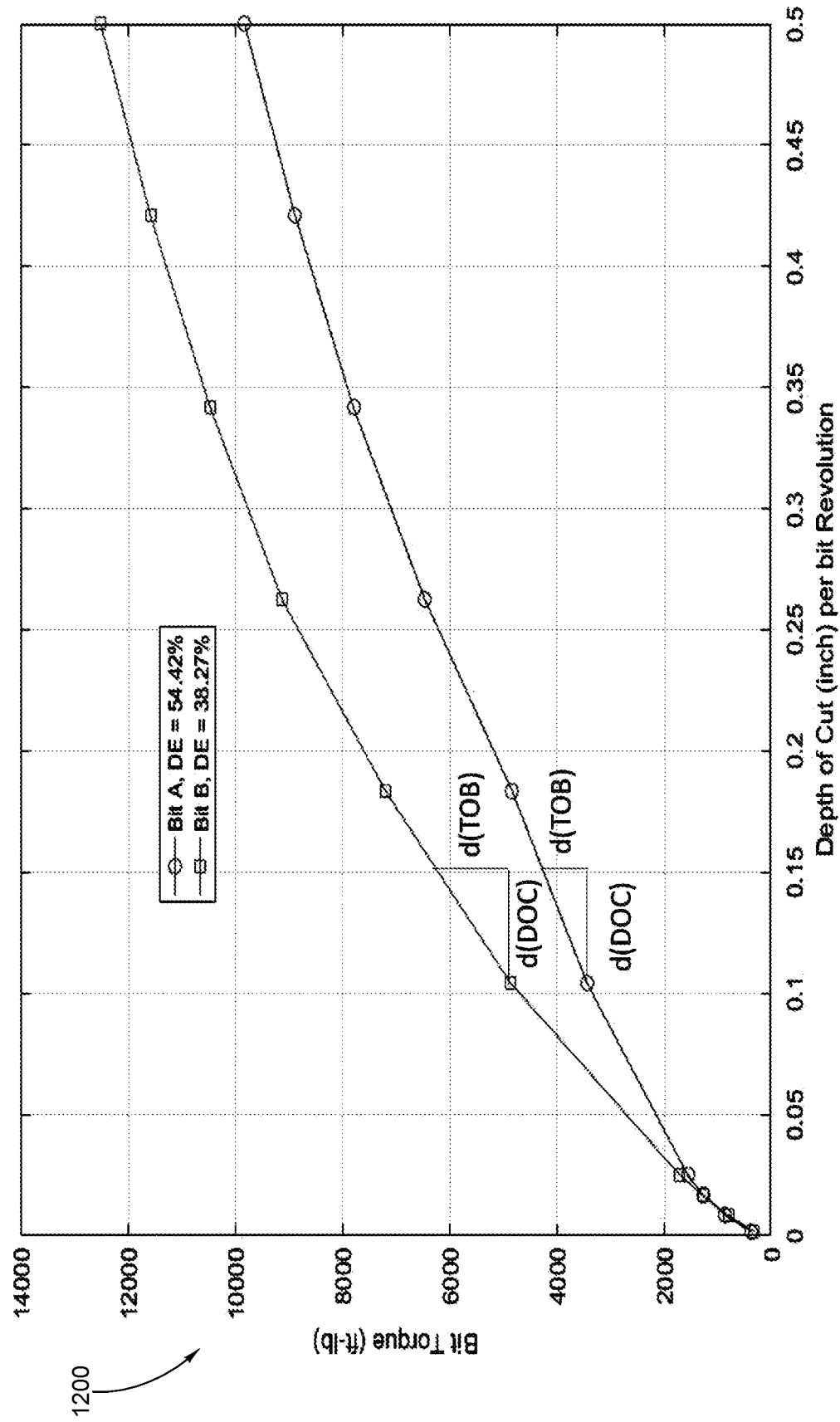
FIG. 12 is a graph that depicts reactive bit torque profiles generated by a drill bit performance model for a pair of test bits as computed in accordance with collected drilling parameters in accordance with some embodiments.

In some embodiments, reactive torque may be utilized in addition to or alternatively to bit drilling efficiency as the threshold performance efficiency metric used for drill bit design. For example, reactive torque log 232 may include reactive torque data for each of the test drill bits in the form of modeled or measured bit torque as a function of depth of cut per revolution (DOC). FIG. 12 depicts an exemplary reactive bit torque profiles 1200 generated by a drill bit performance model for two test bits in accordance with collected drilling parameters according to one or more embodiments of the present disclosure. As shown by profiles 1200, bit A has a much lower reactive torque than bit B, resulting in bit A having a much higher drilling efficiency since reactive torque varies inversely with drilling efficiency. In this manner stick-slip correlator 222 may apply bit reactive torque as a function of DOC or an average reactive torque value as an alternative means for drill bit design selection. Stick-slip correlator 222 may apply slop of bit reactive torque as a function of DOC or an average slop of bit reactive torque as a function of DOC. The slop is defined as the derivative of torque to depth of cut, slop=d(TOB)/d(DOC).

Figure 13:
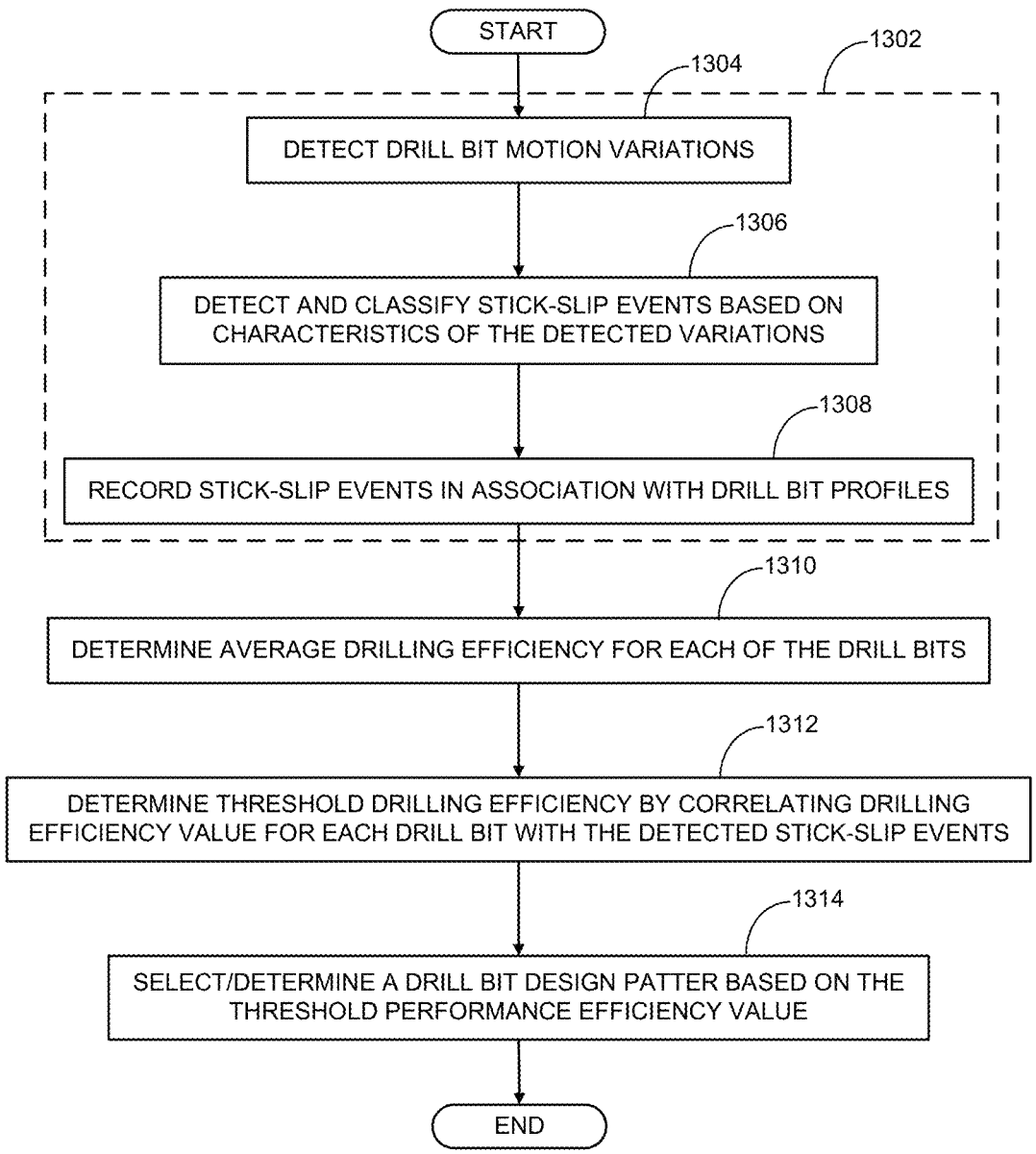
FIG. 13 is a flow diagram illustrating operations and functions performed for selecting or determining a drill bit design in accordance with some embodiments.

FIG. 13 is a flow diagram illustrating operations and functions performed for selecting or determining a drill bit design in accordance with some embodiments. The operations and functions depicted and described in FIG. 13 may be performed by one or more of systems, devices, and components depicted and described with reference to FIGS. 1-12 and 14-16. The process begins as shown at superblock 1302, which depicts an exemplary procedure for correlating each of a set of multiple drill bits with stick-slip events. Each of the drill bits has a respective design pattern comprising a combination of structural attributes such as number of blades, bit size, chamfer size, etc. In some embodiments, the design pattern for each of the drill bits comprises a different combination of structural attributes than the design patterns of the other drill bits. The correlation operations begin at block 1304 with on-bit motion sensors detecting and recording variations in drill bit motion parameters such as rotational velocity and radial and axial acceleration. At block 1306, a stick-slip detector detects and classifies stick-slip events based on characteristics of the detected variations in drill bit motion. The correlation concludes at block 1308, with the design selection system recording the detected and classified stick-slip events in association with the profiles including structural attributes and bit ID of the corresponding drill bits.

At block 1310, a bit performance modeling component in combination with a post-model processing component such as a stick-slip correlator determines the average drilling efficiency values for each of the drilling bits. At block 1312, a threshold drilling efficiency is determined by correlating a performance efficiency value, such as an drilling efficiency value for each drill bit with the detected and classified stick-slip events. For example, a stick-slip correlator may be configured to correlate the drilling efficiency values, such as average drilling efficiencies for each of the test drill bits with the stick-slip events recorded in a stick-slip log. As part of the correlation the stick-slip correlator may generate records that, based on drill bit ID, associate the recorded stick-slip events for each drill bit with drilling efficiency data and drill bit attribute combinations for the same drill bit. The process concludes at block 1314 with a bit design component selecting or determining a drill bit design pattern based on the threshold drilling efficiency determined at block 1312.

Figure 14:
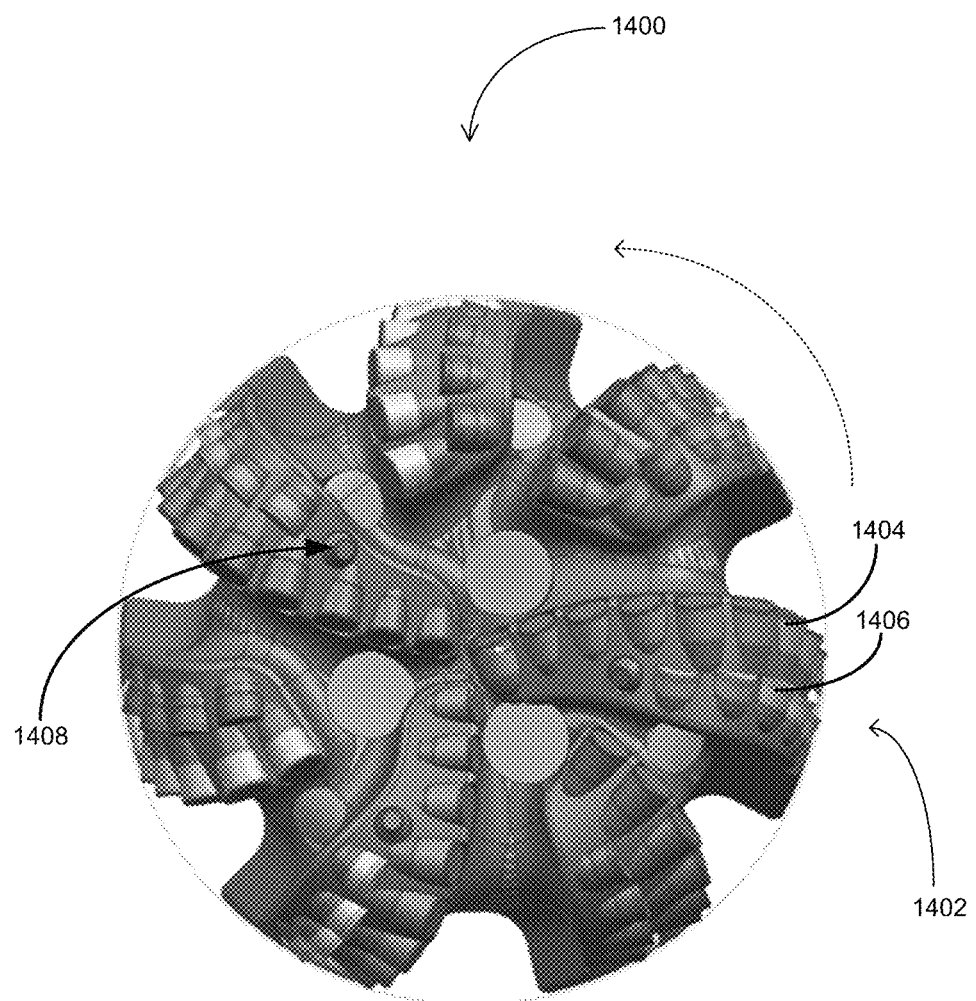
FIG. 14 is a drawing of a bit face of a fixed cutter drill bit that may be designed and utilized in accordance with some embodiments.

FIG. 14 depicts a bit face of an exemplary fixed cutter drill bit 1400 that may be designed and utilized in accordance with some embodiments. Drill bit 1400 may be a PDC bit and includes seven blades, including a blade 1402, that are individually and collectively contoured on the bit face in a spiral pattern. Although seven blades are shown in this example, alternative numbers of blades may be present. Drill bit 1400 includes a combination of structural attributes including number of blades, primary cutters, backup cutters, and a depth of cut determined by a depth of cut controller 1408. The structural attributes are selected during a design process such that the bit DE matches or exceeds a threshold DD value determined as explained with reference to FIGS. 1-13. For example, blade 1402 which may be representative of the other six blades, includes a set of primary cutters 1404 and a set of backup cutters 1406. The primary and backup cutters on the seven blades are configured to cut formation material when rotated in the depicted counterclockwise direction.

Figure 15:
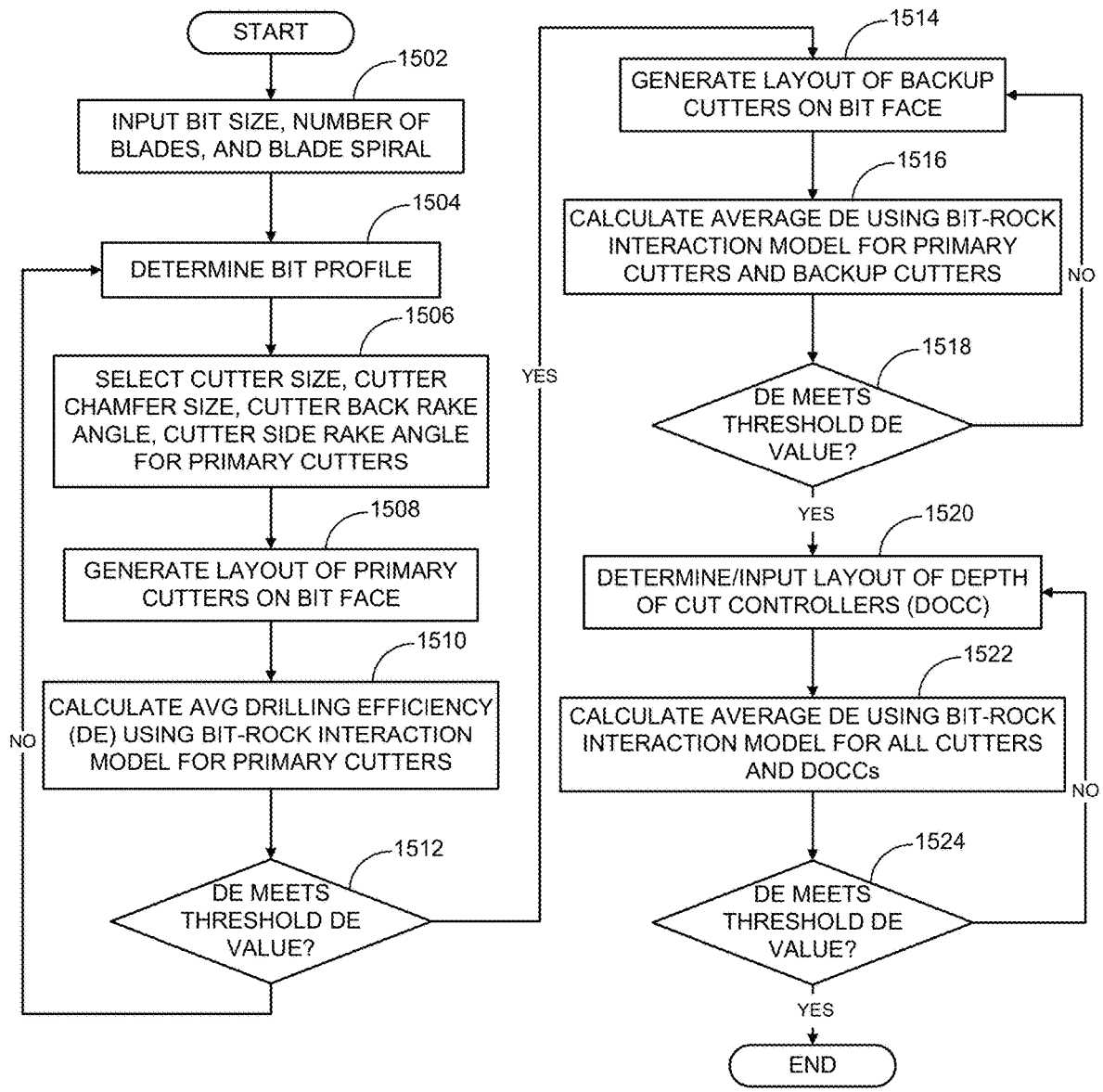
FIG. 15 is a flow diagram illustrating operations and functions performed for designing a drill bit in accordance with some embodiments.

FIG. 15 is a flow diagram illustrating operations and functions performed for designing a drill bit such as drill bit 1400 in accordance with some embodiments. The process begins following the determination of a threshold performance efficiency value such as a threshold drilling efficiency value in the depicted embodiment. At block 1502, the basic drill bit structure is input to a programmed design tool such as design select component 228 in FIG. 2. The structure characteristics may include bit size, number of blades, and the curvature of the blade spiral formed by the blade configuration. At block 1504, the design tool determines bit profile in terms of bit height and radius that is determined based on the combination of input structure characteristics.

At block 1506, a set of drill bit structural attributes that individually and in combination may affect drilling efficiency are selected and input to the design tool. At block 1508, the design tool generates a layout of the primary cutters on a simulated bit face based on the combination of structural attributes input at block 1506. At block 1510, the design tool calculates an average DE using a bit-rock interaction model using the primary cutter layout information. At inquiry block 1512, the design tool determines whether or not the average DE calculated at block 1510 meets, in terms of exceeding or possibly matching, a pre-specified threshold DE. In response to the calculated average DE not meeting the threshold, the design tool returns control to block 1504 to repeat one or more of the structural attribute selection entry steps.

In response to the calculated average DE meeting the threshold, control passes to block 1514 with the design tool determining and generating a layout of the backup cutters on the bit face. As for the generated primary cutters layout, the layout generated at block 1514 is based on the combination of structural features and attributes input at blocks 1502, 1504, and/or 1506. At block 1516, the design tool calculates an average DE using a bit-rock interaction model using the backup cutter layout information in combination with the previously selected primary cutter layout. At inquiry block 1518, the design tool determines whether or not the average DE calculated at block 1516 meets, in terms of exceeding or possibly matching, the pre-specified threshold DE. In response to the calculated average DE not meeting the threshold, the design tool returns control to block 1514 to determine and generate an alternate backup cutter layout. The alternate backup cutter layout may comprise modifying the backup cutter structural attributes such as back rake angle or removing backup cutters from the design.

In response to the calculated average DE meeting the threshold, control passes to block 1520 with the design tool determining and generating a layout of the depth-of-cut controllers (DOCC) on the bit face. The layout generated at block 1520 is based on the combination of structural features and attributes input at blocks 1502, 1504, and/or 1506 as modified during the DE evaluation sequences performed beginning at each of inquiry blocks 1512 and 1518. At block 1522, the design tool calculates an average DE using a bit-rock interaction model using the DOCC layout information in combination with the previously selected backup cutter layout and primary cutter layout information. At inquiry block 1524, the design tool determines whether or not the average DE calculated at block 1522 meets, in terms of exceeding or possibly matching, the pre-specified threshold DE. In response to the calculated average DE not meeting the threshold, the design tool returns control to block 1520 to determine and generate an alternate DOCC layout. The process ends in response to the calculated average DE meeting the threshold.

Figure 16:
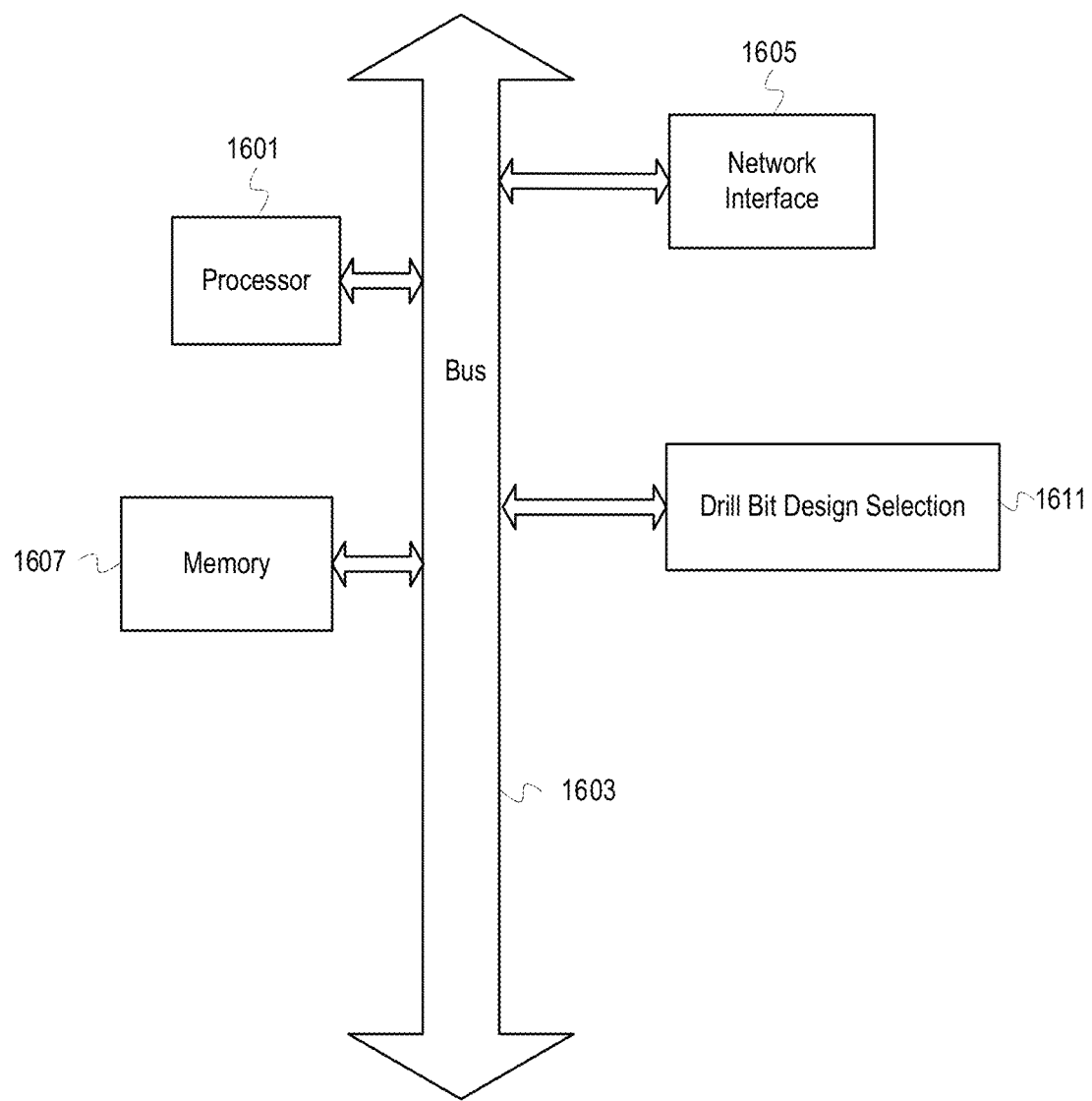
FIG. 16 is a block diagram depicting an example computer system configured to perform operations and functions described with reference to FIGS. 1-15.

FIG. 16 depicts an example computer system, according to some embodiments. The computer system includes a processor 1601 (possibly including multiple processors, multiple cores, multiple nodes, and/or implementing multi-threading, etc.). The computer system includes a memory 1607. The memory 1607 may be system memory (e.g., one or more of cache, SRAM, DRAM, eDRAM, EEPROM, NRAM, etc.) or any one or more of the above already described possible realizations of machine-readable media. The computer system also includes a bus 1603 (e.g., PCI, ISA) and a network interface 1605.

The computer system includes a drill bit design selection system 1611, which may be hardware, software, firmware, or a combination thereof. For example, the drill bit design selection system 1611 may comprise instructions executable by the processor 1601. Any one of the previously described functionalities may be partially (or entirely) implemented in hardware and/or on the processor 1601. For example, the functionality may be implemented with an application specific integrated circuit, in logic implemented in the processor 1601, in a co-processor on a peripheral device or card, etc. The drill bit design selection system 1611 correlates field-collected sets of stick-slip information for a diverse set of drill bits and correlates the stick-slip information with performance efficiency data determined for the same set of drill bits. Based on the correlation, a threshold performance efficiency value is generated and utilized to select or determine a drill bit design pattern in the manner described above. Additional realizations may include fewer or more components not expressly illustrated in FIG. 16 (e.g., video cards, audio cards, additional network interfaces, peripheral devices, etc.). The processor 1601 and the network interface 1605 are coupled to the bus 1603. Although illustrated as being coupled to the bus 1603, the memory 1607 may be coupled to the processor 1601.

Variations

While the aspects of the disclosure are described with reference to various implementations, these aspects are illustrative and the scope of the claims is not limited thereto. In general, techniques for selecting drill bit design patterns as described herein may be implemented with facilities consistent with any hardware system or hardware systems. Plural instances may be provided for components, operations or structures described herein as a single instance. Finally, boundaries between various components, operations and data stores can vary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components.

The flowcharts are provided to aid in understanding the illustrations and are not to be used to limit scope of the claims. The flowcharts depict example operations that can vary within the scope of the claims. The operations may be performed in parallel and/or in a different order. Each block of the flowchart illustrations and/or block diagrams, and combinations of blocks in the flowchart illustrations and/or block diagrams, can be implemented by program code provided to a processor of a general purpose computer, special purpose computer, or other programmable machine or apparatus.

Aspects of the disclosure may be embodied as a system, method or program code/instructions stored in one or more machine-readable media. Aspects may take the form of hardware, software (including firmware, resident software, micro-code, etc.), or a combination of software and hardware aspects that may all generally be referred to herein as a "circuit," "module" or "system." The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as part of a carrier wave. Such a propagated signal may take any of a variety of forms, including, but not limited to, electro-magnetic, optical, or any suitable combination thereof. A machine readable signal medium may be any machine readable medium that is not a machine readable storage medium and that can communicate, propagate, or transport a program for use by or in connection with an instruction execution system, apparatus, or device. Program code embodied on a machine readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including procedural and object oriented programming languages; a dynamic programming language; a scripting language; and conventional procedural programming languages. The program code may execute entirely on a stand-alone machine, may execute in a distributed manner across multiple machines, and may execute on one machine while providing results and or accepting input on another machine. The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks. Use of the phrase "at least one of" preceding a list with the conjunction "and" should not be treated as an exclusive list and should not be construed as a list of categories with one item from each category, unless specifically stated otherwise.

EXAMPLE EMBODIMENTS

Embodiment 1: a method comprising: correlating each of a plurality of test drill bits with stick-slip events, wherein each of the plurality of test drill bits has a mutually distinct design pattern comprising a combination of structural attributes, wherein said correlating comprises, for each of the plurality of test drill bits, detecting variations in motion of the test drill bit during drilling operation; detecting stick-slip based on the detected variations in motion of the test drill bit; and in response to detecting stick-slip, recording a stick-slip event in association with the test drill bit; determining a performance efficiency value for each of the plurality of test drill bits; correlating the determined performance efficiency values with the stick-slip events to determine a threshold performance efficiency value; and selecting or determining a design pattern for a drill bit based, at least in part, on the threshold performance efficiency value.

Embodiment 2: the method of Embodiment 1 wherein each of the test drill bits includes a motion sensor comprising components for detecting rotational speed and acceleration, said detecting variations in motion of the test drill bit comprising detecting rotational speed and acceleration of the test drill bit.

Embodiment 3: the method of Embodiments 1-2, wherein said detecting the stick-slip comprises detecting a reduction in drill bit rotational speed to zero or near zero.

Embodiment 4: the method of Embodiments 1-3, further comprising: classifying a detected stick-slip as a bit induced stick-slip based, at least in part, on characteristics of rotational speed and acceleration of the test drill bit and wherein said recording the stick-slip event comprises recording the stick-slip event as a bit induced stick-slip event.

Embodiment 5: the method of Embodiments 1-4, wherein said classifying a detected stick-slip comprises classifying a detected stick-slip as a bit induced stick-slip based on a high axial vibration during a slip phase and a coupling of axial vibration and torsional vibration.

Embodiment 6: the method of Embodiments 1-5, further comprising: classifying a detected stick-slip as being a drill string induced stick-slip based, at least in part, on characteristics of rotational speed and acceleration of the drill bit; and wherein said recording the stick-slip event comprises recording the stick-slip event as excluded from bit induced stick-slip events.

Embodiment 7: the method of Embodiments 1-6, wherein said classifying a detected stick-slip comprises classifying a detected stick-slip as being a drill string induced stick-slip based on a smooth axial vibration during a slip phase and absence of coupling of axial vibration and torsional vibration.

Embodiment 8: the method of Embodiments 1-7, wherein said correlating the determined performance efficiency values with the stick-slip events comprises: determining, among the plurality of test drill bits having a recorded bit induced stick-slip event, a test drill bit having a highest performance efficiency value; and determining the threshold performance efficiency value to be higher than the highest performance efficiency value.

Embodiment 9: the method of Embodiments 1-8, further comprising: determining variations in a drilling performance efficiency metric corresponding to variations in one or more of the structural attributes within the design patterns; assigning a weighting to one or more of the structural attributes within the design patterns based on the determined variations; wherein said selecting or determining a design pattern for a drill bit comprises selecting or determining a design pattern based, at least in part, on the threshold performance efficiency value and the assigned weighting of the one or more structural attributes.

Embodiment 10: the method of Embodiments 1-9, wherein the performance efficiency value is a drilling efficiency value, and wherein determining a drilling efficiency value for each of the plurality of test drill bits comprises determining an average drilling efficiency value for each of the plurality of test drill bits using a bit rock model.

Embodiment 11: the method of Embodiments 1-10, wherein the performance efficiency value is a reactive torque value, and wherein determining a reactive torque value for each of the plurality of test drill bits comprises determining an average reactive torque value for each of the plurality of test drill bits.

Embodiment 12: the method of Embodiments 1-11, wherein the performance efficiency value is a slop of reactive torque versus depth of cut per revolution, and wherein determining a slop value for each of the plurality of test drill bits comprises determining an average slop value for each of the plurality of test drill bits.

Embodiment 13: the method of Embodiments 1-12, wherein said determining a performance efficiency metric comprises: for each of the plurality of test drill bits, determining a weight-on-bit (WOB) during said operation; measuring a rotation speed (RPM) during said operation; determining a torque-on-bit (TOB) during said operation; determining a rate-of-penetration (ROP) during said operation; determining a drill bit specific energy ($E_s$) based, at least in part, on the WOB, RPM, TOB, and a borehole cross-section area (A).

Embodiment 14: the method of Embodiments 1-13, wherein said determining $E_s$ comprises computing $E_s$ in accordance with the relation:

$$E_s = \frac{WOB}{A} + \frac{120\pi(RPM)(TOB)}{A(ROP)}$$

Embodiment 15: the method of Embodiments 1-14, wherein said determining a performance efficiency metric comprises: determining compressive rock strength, $\sigma_{rock}$, of formation material proximate to the operation of one or more of the plurality of test drill bits; and determining a drilling efficiency (DE) in accordance with the relation $$DE = \frac{\sigma_{rock}}{E_s}.$$

Embodiment 16: A system comprising: a processor; a computer-readable medium having instructions stored thereon that are executable by the processor to cause the apparatus to, correlate each of a plurality of test drill bits with stick-slip events, wherein each of the plurality of test drill bits has a mutually distinct design pattern comprising a combination of structural attributes, wherein said correlating comprises, for each of the plurality of test drill bits, receiving detected variations in motion of the test drill bit during drilling operation; detecting stick-slip based on the detected variations in motion of the test drill bit; and in response to detecting stick-slip, recording a stick-slip event in association with the test drill bit; determine a performance efficiency value for each of the plurality of test drill bits; correlate the determined performance efficiency values with the stick-slip events to determine a threshold performance efficiency value; and select or determine a design pattern for a drill bit based, at least in part, on the threshold performance efficiency value.

Embodiment 17: a method comprising: generating a cutters layout based, at least in part, on a combination of drill bit structural attributes including cutter chamfer size and cutter rake angle; calculating a first average drilling efficiency (DE) using a bit-rock interaction model based on the generated cutters layout; and comparing the first average DE with a threshold DE; and determining whether to modify the combination of drill bit structural attributes based on whether the first average DE matches or exceeds the threshold DE.

Embodiment 18: the method of Embodiment 17, wherein the cutters layout comprises a primary cutters layout, said method further comprising: generating a backup cutters layout in response to determining that the first average DE matches or exceeds the threshold DE; calculating a second average DE using a bit-rock interaction model based on the generated backup cutters layout in combination with the primary cutters layout; comparing the second average DE with the threshold DE; and determining whether to modify the combination of drill bit structural attributes based on whether the second average DE matches or exceeds the threshold DE.

Embodiment 19: the method of Embodiments 17-18, further comprising in response to determining that the second average DE does not match or exceed the threshold DE, modifying backup cutters layout.

Embodiment 20: the method of Embodiments 17-19, further comprising: generating a depth-of-cut controllers (DOCC) layout in response to determining that the second average DE matches or exceeds the threshold DE; calculating a third average DE using a bit-rock interaction model based on the generated DOCC layout in combination with the backup cutters layout and the primary cutters layout; comparing the third average DE with the threshold DE; and determining whether to modify the combination of drill bit structural attributes based on whether the third average DE matches or exceeds the threshold DE.

What is claimed is:

1. A method comprising:
correlating each of a plurality of test drill bits with stick-slip events, each of the plurality of test drill bits having a different design pattern comprising a combination of structural attributes, wherein said correlating comprises, for each of the plurality of test drill bits,
detecting variations in motion of the test drill bit during drilling operation;
detecting stick-slip based on the detected variations in motion of the test drill bit; and
in response to detecting stick-slip, recording a stick-slip event in association with the test drill bit;
determining a drilling efficiency value for each of the plurality of test drill bits;
correlating the determined drilling efficiency values with the stick-slip events to determine a threshold performance efficiency value, wherein the threshold performance efficiency value is a value above or below which bit induced stick-slip does not occur; and
selecting and constructing a drill bit having a design pattern based, at least in part, on the threshold performance efficiency value.

2. The method of claim 1, wherein each of the test drill bits includes a motion sensor comprising components for detecting rotational speed and acceleration, said detecting variations in motion of the test drill bit comprising detecting rotational speed and acceleration of the test drill bit.

3. The method of claim 2, wherein said detecting the stick-slip comprises detecting a reduction in drill bit rotational speed to at or about zero.

4. The method of claim 2, further comprising:
classifying a detected stick-slip as a bit induced stick-slip based, at least in part, on rotational speed and acceleration of the test drill bit and
wherein said recording the stick-slip event comprises recording the stick-slip event as a bit induced stick-slip event.

5. The method of claim 4, wherein said classifying a detected stick-slip comprises classifying a detected stick-slip as a bit induced stick-slip based on a relatively high axial vibration during a slip phase and a coupling of axial vibration and torsional vibration.

6. The method of claim 2, further comprising:
classifying a detected stick-slip as being a drill string induced stick-slip based, at least in part, on rotational speed and acceleration of the test drill bit; and
wherein said recording the stick-slip event comprises recording the stick-slip event as excluded from bit induced stick-slip events.

7. The method of claim 6, wherein said classifying a detected stick-slip comprises classifying a detected stick-slip as being a drill string induced stick-slip based on a relatively low axial vibration during a slip phase and absence of coupling of axial vibration and torsional vibration.

8. The method of claim 1, wherein said correlating the determined drilling efficiency values with the stick-slip events comprises:
determining, among the plurality of test drill bits having a recorded bit induced stick-slip event, a test drill bit having a highest drilling efficiency value; and
determining the threshold performance efficiency value to be higher than the highest drilling efficiency value.

9. The method of claim 1, further comprising:
determining variations in the drilling efficiency value corresponding to variations in one or more of the structural attributes within the design patterns;
assigning a weighting to one or more of the structural attributes within the design patterns based on the determined variations;
wherein said selecting and constructing a drill bit comprises selecting or determining a design pattern based, at least in part, on the threshold performance efficiency value and the assigned weighting of the one or more structural attributes.

10. The method of claim 1, wherein determining the drilling efficiency value for each of the plurality of test drill bits comprises determining an average drilling efficiency value for each of the plurality of test drill bits using a bit rock model.

11. The method of claim 1, wherein the drilling efficiency value is a reactive torque value, and wherein determining a reactive torque value for each of the plurality of test drill bits comprises determining an average reactive torque value for each of the plurality of test drill bits.

12. The method of claim 1, wherein the drilling efficiency value is a slop of reactive torque versus depth of cut per revolution, and wherein determining a slop value for each of the plurality of test drill bits comprises determining an average slop value for each of the plurality of test drill bits.

13. The method of claim 1, wherein said determining a drilling efficiency value comprises:
for each of the plurality of test drill bits,
determining a weight-on-bit (WOB) during said operation;
measuring a rotation speed (RPM) during said operation;

determining a torque-on-bit (TOB) during said operation; and determining a drill bit specific energy ($E_s$) based, at least in part, on the WOB, RPM, TOB, and a borehole cross-section area (A).

14. The method of claim 13, wherein said determining $E_s$ comprises, for each of the test drill bits, determining a rate-of-penetration (ROP) during said operation and computing $E_s$ in accordance with the relation:

$$E_s = \frac{WOB}{A} + \frac{120\pi(RPM)(TOB)}{A(ROP)}.$$

15. The method of claim 14, wherein said determining a drilling efficiency value comprises:

determining compressive rock strength, $\sigma_{rock}$, of formation material proximate to the operation of one or more of the plurality of test drill bits; and determining a drilling efficiency (DE) in accordance with the relation $$DE = \frac{\sigma_{rock}}{E_s}.$$

16. A system comprising:

a processor;

a non-transitory computer-readable medium having instructions stored thereon that are executable by the processor to cause a drill bit design apparatus to, correlate each of a plurality of test drill bits with stick-slip events, each of the plurality of test drill bits having a different design pattern comprising a different combination of structural attributes, wherein said correlating comprises, for each of the plurality of test drill bits, receiving detected variations in motion of the test drill bit during drilling operation;

detecting stick-slip based on the detected variations in motion of the test drill bit; and in response to detecting stick-slip, recording the stick-slip event in association with the test drill bit;

determine a drilling efficiency value for each of the plurality of test drill bits;

correlate the determined drilling efficiency values with the stick-slip events to determine a threshold performance efficiency value, wherein the threshold performance efficiency value is a value above or below which bit induced stick-slip does not occur; and select or determine a design pattern for construction of a drill bit for use in a wellbore based, at least in part, on the threshold performance efficiency value.

* * * * *